(12) United States Patent
Burak et al.

(10) Patent No.: US 9,246,473 B2
(45) Date of Patent: Jan. 26, 2016

(54) ACOUSTIC RESONATOR COMPRISING COLLAR, FRAME AND PERIMETER DISTRIBUTED BRAGG REFLECTOR

(71) Applicant: Avago Technologies General IP (Singapore) Pte. Ltd., Singapore (SG)

(72) Inventors: Dariusz Burak, Fort Collins, CO (US); John Choy, Westminster, CO (US); Phil Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 153 days.

(21) Appl. No.: 13/955,774

(22) Filed: Jul. 31, 2013

(65) Prior Publication Data

US 2013/0314177 A1 Nov. 28, 2013

Related U.S. Application Data

(63) Continuation-in-part of application No. 13/781,491, filed on Feb. 28, 2013, and a continuation-in-part of application No. 13/663,449, filed on Oct. 29, 2012, and a continuation-in-part of application No. 13/208,883, filed on Aug. 12, 2011, and a continuation-in-part of application No. 13/074,262, filed on Mar. 29, 2011.

(51) Int. Cl.
*H03H 9/54* (2006.01)
*H03H 9/15* (2006.01)
(Continued)

(52) U.S. Cl.
CPC .............. *H03H 9/54* (2013.01); *H03H 9/02118* (2013.01); *H03H 9/173* (2013.01); *H03H 9/175* (2013.01); *H03H 9/587* (2013.01); *H03H 9/589* (2013.01); *H03H 9/585* (2013.01)

(58) Field of Classification Search
CPC . H03H 9/0211; H03H 9/02118; H03H 9/173; H03H 9/174; H03H 9/175; H03H 9/587; H03H 9/588; H03H 9/589; H03H 9/02086; H03H 9/54; H03H 9/585
USPC .................................................. 333/187, 189
See application file for complete search history.

(56) References Cited

U.S. PATENT DOCUMENTS

| 5,587,620 A | 12/1996 | Ruby et al. |
|---|---|---|
| 5,873,153 A | 2/1999 | Ruby et al. |

(Continued)

FOREIGN PATENT DOCUMENTS

| JP | 2007-208845 | * | 8/2007 |
|---|---|---|---|
| JP | 2008-131194 | | 6/2008 |

(Continued)

OTHER PUBLICATIONS

Ohara et al.; "Suppression of Acoustic Energy Lealkage in FBARs with Al Bottom Electrode: FEM Simulation and Experimental Results"; 2007 IEEE Ultrasonics Symposium, Oct. 28-31, 2007, pp. 1657-1660 and one page IEEE Xplore abstract.*

(Continued)

*Primary Examiner* — Barbara Summons

(57) ABSTRACT

An acoustic resonator includes a bottom electrode disposed over a substrate, a piezoelectric layer disposed over the bottom electrode, a top electrode disposed over the piezoelectric layer, and a cavity disposed beneath the bottom electrode. An overlap of the bottom electrode, the piezoelectric layer and the top electrode defines a main membrane region of the acoustic resonator structure. The acoustic resonator further includes an acoustic reflector disposed over the substrate adjacent to the cavity, the acoustic reflector including a layer of low acoustic impedance material stacked on a layer of high acoustic impedance material.

31 Claims, 19 Drawing Sheets

(51) Int. Cl.
*H03H 9/02* (2006.01)
*H03H 9/58* (2006.01)
*H03H 9/17* (2006.01)

(56) References Cited

U.S. PATENT DOCUMENTS

| | | | |
|---|---|---|---|
| 6,107,721 A | | 8/2000 | Lakin |
| 6,291,931 B1 | | 9/2001 | Lakin |
| 6,384,697 B1 | | 5/2002 | Ruby |
| 6,424,237 B1 | | 7/2002 | Ruby et al. |
| 6,507,983 B1 | | 1/2003 | Ruby et al. |
| 6,548,943 B2 | | 4/2003 | Kaitila et al. |
| 6,709,776 B2 | | 3/2004 | Noguchi et al. |
| 6,864,619 B2 | | 3/2005 | Aigner et al. |
| 6,985,051 B2 | | 1/2006 | Nguyen et al. |
| 7,199,683 B2 | | 4/2007 | Thalhammer |
| 7,259,498 B2 | | 8/2007 | Nakatsuka et al. |
| 7,275,292 B2 | | 10/2007 | Ruby et al. |
| 7,280,007 B2 | | 10/2007 | Feng et al. |
| 7,345,410 B2 | | 3/2008 | Grannen et al. |
| 7,358,831 B2 | | 4/2008 | Larson, III et al. |
| 7,388,454 B2 | | 6/2008 | Ruby et al. |
| 7,408,429 B2 | | 8/2008 | Iwasaki et al. |
| 7,466,213 B2 | | 12/2008 | Lobl et al. |
| 7,468,608 B2 | | 12/2008 | Feucht et al. |
| 7,575,292 B2 | | 8/2009 | Furukawa |
| 7,616,079 B2 | | 11/2009 | Tikka et al. |
| 7,629,865 B2 | | 12/2009 | Ruby |
| 7,636,026 B2 | | 12/2009 | Heinze et al. |
| 7,889,024 B2 | | 2/2011 | Bradley et al. |
| 7,966,722 B2 | | 6/2011 | Hart et al. |
| 7,986,198 B2 | | 7/2011 | Nakatsuka et al. |
| 8,008,993 B2 | | 8/2011 | Milsom et al. |
| 8,030,823 B2 | | 10/2011 | Sinha et al. |
| 8,222,795 B2 | | 7/2012 | Sinha et al. |
| 8,384,497 B2 | | 2/2013 | Zhang |
| 8,456,257 B1 | * | 6/2013 | Fattinger ............... 333/187 |
| 2002/0153965 A1 | | 10/2002 | Ruby et al. |
| 2004/0046622 A1 | | 3/2004 | Aigner et al. |
| 2005/0206479 A1 | | 9/2005 | Nguyen et al. |
| 2007/0205850 A1 | | 9/2007 | Jamneala et al. |
| 2008/0060181 A1 | * | 3/2008 | Fazzio et al. ............ 29/25.35 |
| 2008/0129414 A1 | | 6/2008 | Lobl et al. |
| 2008/0179995 A1 | * | 7/2008 | Umeda et al. ............ 310/324 |
| 2008/0258842 A1 | | 10/2008 | Ruby et al. |
| 2009/0001848 A1 | * | 1/2009 | Umeda et al. ............ 310/312 |
| 2009/0102319 A1 | * | 4/2009 | Nakatsuka et al. ....... 310/326 |
| 2009/0153268 A1 | * | 6/2009 | Milsom et al. ............ 333/187 |
| 2010/0039000 A1 | | 2/2010 | Milson et al. |
| 2010/0091370 A1 | | 4/2010 | Mahrt et al. |
| 2010/0107389 A1 | | 5/2010 | Nessler et al. |
| 2010/0327697 A1 | | 12/2010 | Choy et al. |
| 2010/0327994 A1 | | 12/2010 | Choy et al. |
| 2011/0121916 A1 | | 5/2011 | Barber et al. |
| 2011/0180391 A1 | | 7/2011 | Larson et al. |
| 2011/0204996 A1 | | 8/2011 | Gilbert et al. |
| 2011/0227671 A1 | | 9/2011 | Zhang |
| 2011/0266925 A1 | | 11/2011 | Ruby et al. |
| 2012/0177816 A1 | | 7/2012 | Larson et al. |
| 2012/0218060 A1 | | 8/2012 | Burak et al. |
| 2013/0038408 A1 | | 2/2013 | Burak et al. |
| 2013/0106534 A1 | | 5/2013 | Burak et al. |
| 2013/0127300 A1 | | 5/2013 | Umeda et al. |
| 2013/0241673 A1 | | 9/2013 | Yokoyama et al. |
| 2013/0314177 A1 | | 11/2013 | Burak et al. |
| 2014/0111288 A1 | | 4/2014 | Nikkel et al. |
| 2014/0118088 A1 | | 5/2014 | Burak et al. |
| 2014/0118091 A1 | | 5/2014 | Burak et al. |
| 2014/0118092 A1 | | 5/2014 | Burak et al. |

FOREIGN PATENT DOCUMENTS

| | | | |
|---|---|---|---|
| JP | 2008-211394 | * | 9/2008 |
| WO | 2006079353 | | 8/2006 |
| WO | WO-2007085332 | | 8/2007 |
| WO | 2013065488 | | 5/2013 |

OTHER PUBLICATIONS

English language machine translation of JP 2008-211394, published Sep. 11, 2008.*

Akiyama et al., "Enhancement of Piezoelectric Response in Scandium Aluminum Nitride Alloy Thin Films Prepared by Dual Reactive Co-Sputtering", Advanced Materials 2009, vol. 21, pp. 593-596, published online Dec. 2, 2008.

Moriera, et al., "Aluminum Scandium Nitride Thin-Film Bulk Acoustic Resonators for Wide Band Applications", Vacuum 86 (2011) 23-26.

Tang, et al. "Micromachined Bulk Acoustic Resonator with a Raised Frame", 16th International Conference on Mechatronics Technology, Oct. 16-19, 2012, Tianjin, China, pp. 19-22.

Pensala, "Thin Film Bulk Acoustic Wave Devices", Dissertation, VTT Publications 756, Feb. 25, 2011, 108 pages.

Co-pending U.S. Appl. No. 13/658,024, filed Oct. 23, 2012.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.
Co-pending U.S. Appl. No. 13/781,491, filed Feb. 28, 2013.
"U.S. Appl. No. 13/232,334, filed Sep. 14, 2011".
"Co-pending U.S. Appl. No. 13/036,489, filed Feb. 28, 2011".
"Co-pending U.S. Appl. No. 13/074,094, filed Mar. 29, 2011".
"Co-pending U.S. Appl. No. 13/074,262, filed Mar. 29, 2011".
"Co-pending U.S. Appl. No. 13/101,376, filed May 5, 2011".
"Co-pending U.S. Appl. No. 13/161,946, filed Jun. 16, 2011".
"Co-pending U.S. Appl. No. 13/286,038, filed Oct. 31, 2011".
"Co-pending U.S. Appl. No. 13/767,765, filed Feb. 14, 2013".
"Co-pending U.S. Appl. No. 14/092,077, filed Nov. 27, 2013".

Archibald, G. W., "Experimental Results of Bulk Acoustic Wave Transverse Graded Electrode Patterns", *Proceedings of the 1998 IEEE International Frequency Control Symposium* 1998, 477-483.

Lee, et al., "Development of High-Auality FBAR Devices for Wireless Applications Employing Two-Step Annealing Treatments", *IEEE Microwave and Wireless Components Letters*, vol. 21, No. 11 Nov. 2011, pp. 604-606.

Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007, 880-885.

Pineda, Humberto, "Thin-Film Bulk Acoustic Wave Resonators—FBAR", *Bellaterra, Monpelier* Dec. 2007, 1-241.

Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010, 448-454.

Umeda, Keiichi et al., "Piezoelectric Properties of ScAlN Thin Films for Piezo-Mems Devices", *MEMS*, 2013, Taipei, Taiwan, Jan. 20-24, 2013 pp. 733-736 2013.

Machine Translation of JP 2007-208845, published Aug. 16, 2007, pp. 1-9.

* cited by examiner

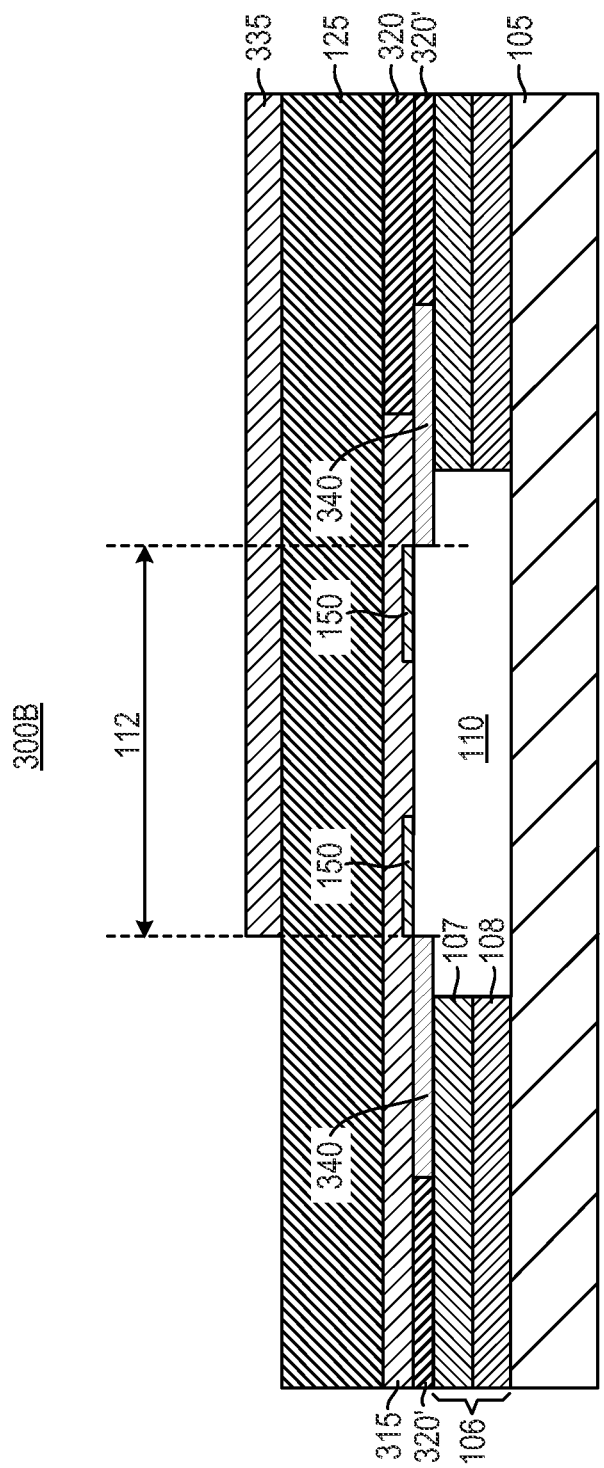

ACOUSTIC RESONATOR COMPRISING COLLAR, FRAME AND PERIMETER DISTRIBUTED BRAGG REFLECTOR

CROSS REFERENCE TO RELATED APPLICATIONS

This application is a continuation-in-part under 37 C.F.R. §1.53(b) of commonly owned U.S. patent application Ser. No. 13/781,491 entitled "Acoustic Resonator Having Collar and Frame," filed on Feb. 28, 2013, which is a continuation-in-part of commonly owned U.S. patent application Ser. No. 13/663,449 entitled "Acoustic Resonator Having Collar Structure," filed on Oct. 29, 2012, which are hereby incorporated by reference in their entireties. This application is also a continuation-in-part under 37 C.F.R. §1.53(b) of commonly owned U.S. patent application Ser. No. 13/208,883 entitled "Stacked Bulk Acoustic Resonator Comprising a Bridge and an Acoustic Reflector along a Perimeter of the Resonator," filed on Aug. 12, 2011 (published as U.S. Patent App. Pub. No. 2012/0218059), which is a continuation-in-part application of commonly owned U.S. patent application Ser. No. 13/074,262 entitled "Stacked Acoustic Resonator Comprising Bridge" filed on Mar. 29, 2011 (published as U.S. Patent App. Pub. No. 2012/0218055), which are hereby incorporated by reference in their entireties.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a first (bottom) electrode and a second (top) electrode over a cavity. BAW resonators may be used in a wide variety of electronic applications, such as cellular telephones, personal digital assistants (PDAs), electronic gaming devices, laptop computers and other portable communications devices. For example, FBARs may be used for electrical filters and voltage transformers.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material, and the peripheral regions are defined as areas outside the main membrane region. Two peripheral regions, in particular, are defined as a region located between the edge of the main membrane region and edge of the air-cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of energy in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region and the peripheral regions.

The lateral modes facilitate continuity of appropriate mechanical particle velocities and stresses between the main membrane region and the peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, a collar may be formed by a dielectric material outside the boundary of the main membrane region to allow a smooth decay of evanescent modes emanating from the boundary and improve confinement of mechanical motion to the main membrane region. In another example, a frame may be formed by a conductive or dielectric material within the boundary of the main membrane region to minimize scattering of electrically excited piston mode at top electrode edges and improve confinement of mechanical motion to the main membrane region.

The conventional implementation of these ancillary structural features has a number of potential shortcomings. For instance, depending on their specific design, they may be a source of additional scattering of the piston mode which may outweigh their benefits. Additionally, they may require the presence of certain additional materials that can deleteriously redistribute the acoustic energy in the acoustic stack, such as relatively soft planarization layers. Also, some design choices may produce only modest performance improvements while significantly driving up cost. Moreover, the formation of ancillary structural features may degrade structural stability or interfere with the formation of overlying layers.

In addition, conventional FBARs rely on strong confinement of electrically excited piston mode. Strong confinement is provided by the edges of the top and bottom electrodes, as well as ancillary structural features, such as air-bridges and conventional outside frames. While the apparent advantage of strong confinement is that it prevents strong electrical excitation of mechanical motion at the edge of the top electrode, it also provides significant acoustic discontinuities, leading to scattering of energy out of the desired piston mode into undesired extensional, shear, flexural and dilatational modes of the whole structure. Accordingly, in view of these and other shortcomings of conventional acoustic resonator structures, there is a general need for improved acoustic resonator designs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 3B is a cross-sectional view of an acoustic resonator according to another representative embodiment.

DETAILED DESCRIPTION

Figure 1A:
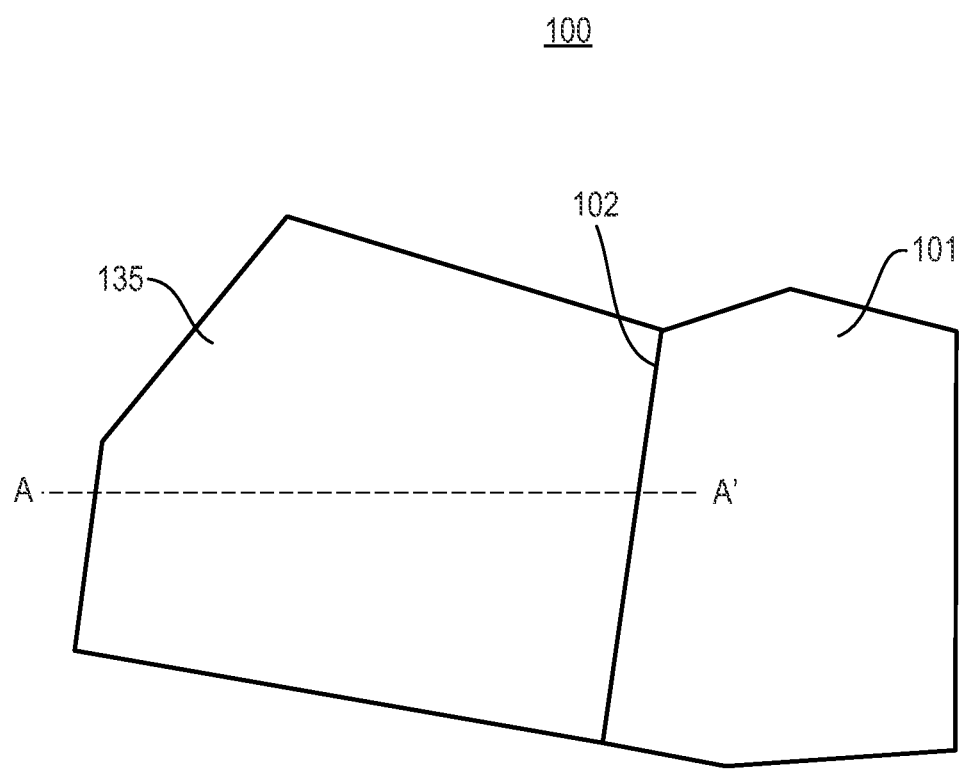
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), although the discussion is directed to FBARs for the sake of convenience. Certain details of acoustic resonators, including materials and methods of fabrication, may be found in one or more of the following commonly owned U.S. patents and patent applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkei et al.; U.S. patent application Ser. No. 13/663,449 to Burak et al.; U.S. patent application Ser. No. 13/660,941 to Burak et al.; U.S. patent application Ser. No. 13/654,718 to Burak et al.; U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In certain embodiments described below, an acoustic resonator comprises a piezoelectric layer disposed between top and bottom electrodes, a collar disposed outside a main membrane region, a frame disposed within the main membrane region, and an acoustic reflector, such as a distributed Bragg reflector (DBR), provided around a perimeter of a cavity defined by the acoustic reflector and/or the substrate and disposed within the main membrane region. The collar typically has an inner edge substantially aligned with a boundary of the main membrane region or somewhat overlapping the main membrane region, and the frame typically has an outer edge substantially aligned with the boundary of the main membrane region.

Generally, the collar couples the evanescent thickness extensional (eTE) and piston modes of the main membrane region to the evanescent thickness extensional mode of the collar region, and the frame suppresses excitation of propagating modes. The frame may be a composite frame, having integrated lateral features, formed of aluminum (Al) and molybdenum (Mo), for example. The perimeter DBR substantially eliminates dead-FBAR by providing acoustic isolation of a connecting edge of the top electrode from the substrate. The perimeter DBR also prevents evanescent and complex modes of the region outside of the top electrode (between the top electrode edge and the substrate edge) from coupling to the substrate, as evanescent and complex modes decay exponentially from the excitation edge located at the top electrode edge. When the collar overlaps with the substrate, the perimeter Distributed Bragg Reflector (DBR) also prevents the eTE mode supported by the collar from coupling to the substrate.

In certain alternative embodiments described below, an acoustic resonator comprises a piezoelectric layer disposed between top and bottom electrodes disposed over a cavity, and a collar disposed outside a main membrane region and/or a frame disposed within the main membrane region, together with a perimeter DBR provided around a perimeter of the cavity disposed within the main membrane region. Or, an acoustic resonator may comprise a piezoelectric layer disposed between top and bottom electrodes disposed over a cavity, and the perimeter DBR provided around the perimeter of the cavity with no collar or frame.

The collar may be formed of a relatively thick dielectric region of finite width, and may be located in various alternative locations, such as above the top electrode, below the bottom electrode, or between the bottom electrode and the piezoelectric layer. The collar may also be divided into multiple layers and formed in more than one of the above locations. Also, the collar may be formed inside other features of the acoustic resonator, for instance, inside the piezoelectric layer. A region of the acoustic resonator above and below the collar will be referred to as a collar region.

The collar is typically designed so that its cut-off frequency is substantially the same as the cutoff frequency in the main membrane region, and its main non-propagating mode (evanescent mode, for instance) has substantially the same modal distribution as the piston mode in the main membrane region. This prevents acoustic energy in the piston mode from being converted into unwanted propagating modes in the collar region and propagating and evanescent modes in the main membrane region. If excited, propagating modes in the collar region in general may lead to energy loss due to acoustic radiation to the region outside of acoustic resonator. Similarly, if excited, propagating and evanescent modes inside the main membrane region may in general produce lateral voltage gradients, which may lead to lateral current flows and energy loss due to the Joule heating. Thus, the collar may improve confinement of the piston mode within the main membrane region while suppressing the excitation of unwanted spurious lateral modes inside and outside of the main membrane region. This, in turn, may reduce overall acoustic scattering loss and enhance the parallel resistance Rp and the quality factor (Q-factor) of the acoustic resonator.

In the absence of the collar, there may be a significant acoustic impedance discontinuity at the edge of the top electrode for an electrically excited piston mode. Because the electric field is also terminated at the edge of top electrode, that edge will cause both mechanical and electrical excitation of evanescent, propagating and complex modes supported by the structures both inside and outside of the main membrane region. Evanescent and complex modes decay exponentially, so a wide enough collar structure will suppress them. Moreover, propagating modes may be suppressed by forming the collar structure with a proper width. Additionally, a collar structure extending over (or under) the top electrode may act as an integrated frame, thus it may minimize the amplitude of electrically excited piston mode before the top electrode edge and provide additional acoustic impedance discontinuities to suppress propagating modes. Thus, in the presence of a properly designed collar, most of the piston mode energy at the top electrode edge may couple to the evanescent mode in the collar region, which may then decay exponentially and become efficiently suppressed inside a wide enough collar structure.

The frame is formed by adding a layer of material, usually an electrically conducting material (although dielectric material is possible as well), to the top and/or bottom electrode. The frame can be either a composite frame or an add-on frame, for example. An add-on frame is formed by depositing the material above or below of a layer forming either the bottom or top electrode along a perimeter of the main membrane region. A composite frame is formed by embedding the material within the top or bottom electrode, typically with an exposed upper or lower surface being coplanar with an upper or lower surface of the top or bottom electrode. The use of a composite frame can simplify fabrication of the acoustic resonator with regard to application of layers on planar surfaces. For instance, it can prevent the formation of outcroppings in overlying layers, which can preserve the structural stability of the acoustic resonator. A region of the acoustic resonator above and below the frame will be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cut-off frequency mismatch and an acoustic impedance mismatch between the frame region and other portions of the main membrane region. A frame that lowers the cut-off frequency in the frame region as compared to the main membrane region will be referred to as a Low Velocity Frame (LVF), while a frame that increases the cut-off frequency in the frame region as compared to the main membrane region will be referred to as a High Velocity Frame (HVF). The reasoning behind this nomenclature is that for composite frames (for which thicknesses of the frame and main membrane regions are substantially the same), an increase or decrease of the cut-off frequency is substantially equivalent to an increase or decrease an effective sound velocity of the stack forming the frame, respectively.

A composite or add-on frame with lower effective sound velocity than the corresponding effective sound velocity of a main membrane (i.e., an LVF) generally increases parallel resistance Rp and Q-factor of the acoustic resonator above the cut-off frequency of the main membrane region. Conversely, a composite or add-on frame with a higher effective sound velocity than the corresponding effective sound velocity of a main membrane (i.e., an HVF) generally decreases series resistance Rs and increases Q-factor of the acoustic resonator below the cut-off frequency of the main membrane region. A typical low velocity frame, for example, effectively provides a region with significantly lower cut-off frequency than the main membrane region and therefore minimizes the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at membrane/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

The perimeter DBR may be formed of a single layer or multiple layers. For example, the DBR may be formed of one or more pairs of layers formed under a bottom electrode where it minimizes a detrimental impact of a so-called "dead-FBAR" region in which acoustic vibrations of the acoustic resonator may be attenuated through mechanical scattering of the electrically excited motion at a boundary between the bottom electrode and an underlying substrate. Each pair of layers consists of a low acoustic impedance layer stacked on a high acoustic impedance layer.

Various examples of collars and frames, as well as related materials and operating characteristics, are described in the above cited U.S. patent application Ser. Nos. 13/663,449 and 13/660,941 to Burak et al. As explained in those applications, collars and frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonant frequency, series resistance Rs, parallel resistance Rp, or electromechanical coupling coefficient $Kt^2$. Although the following description presents several embodiments in the form of FBAR devices, several of the described concepts could be implemented in other forms of acoustic resonators, such as SMRs, for example.

FIG. 1A is a top view of an acoustic resonator 100 according to a representative embodiment, and FIGS. 1B-1E are cross-sectional views of acoustic resonator 100, taken along a line A-A'. The cross-sectional views correspond to different variations of acoustic resonator 100 and will be referred to, respectively, as acoustic resonators 100B-100E. Acoustic resonators 100B-100E have many of the same features, so a repetitive description of these features may be omitted in an effort to avoid redundancy.

Referring to FIG. 1A, acoustic resonator 100 comprises a top electrode 135 having five (5) sides, with a connection side 101 configured to provide an electrical connection to interconnect 102. Interconnect 102 provides electrical signals to top electrode 135 to excite desired acoustic waves in a piezoelectric layer (not shown in FIG. 1A) of acoustic resonator 100.

Figure 1B:
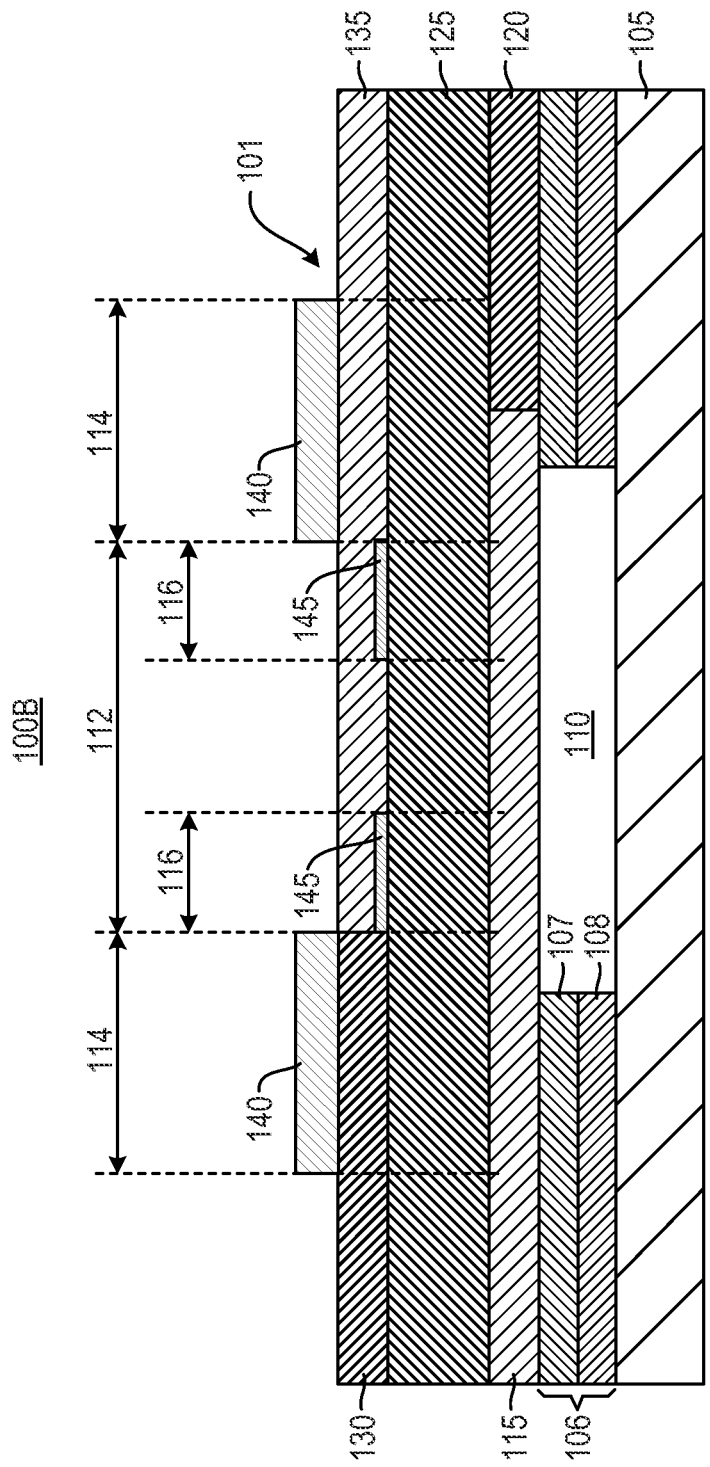
FIG. 1B is a cross-sectional view of an acoustic resonator according to a representative embodiment.

Referring to FIG. 1B, acoustic resonator 100B, which may be an FBAR, for example, comprises a substrate 105 defining an air cavity 110. A perimeter acoustic reflector, indicated by perimeter distributed Bragg reflector (DBR) 106 (also referred to as an acoustic reflector herein), is formed around a perimeter of the cavity 110 over a top surface of the substrate 105. A bottom electrode 115 is disposed on the perimeter DBR 106 over the substrate 105 and the air cavity 110, and a first planarization layer 120 disposed adjacent to the bottom electrode 115. A piezoelectric layer 125 is disposed on the bottom electrode 115 and the first planarization layer 120. A top electrode 135 is disposed on the piezoelectric layer 125, and a second planarization layer 130 is disposed on the piezoelectric layer 125 adjacent to the top electrode 135. Collectively, the bottom electrode 115, the piezoelectric layer 125, and the top electrode 135 constitute an acoustic stack of acoustic resonator 100B. The acoustic resonator 100B further comprises a collar 140 disposed on the second planarization layer 130 and the top electrode 135, and a frame 145 disposed in a bottom portion of the top electrode 135. Although not shown, a passivation layer may be present on top of the top electrode 135 with thickness sufficient to insulate all layers of the resonator stack from the environment, including protection from moisture, corrosives, contaminants, debris and the like.

In the depicted embodiment, the perimeter DBR 106 comprises a single pair of acoustic impedance layers, first acoustic impedance layer 107 and second acoustic impedance layer 108. The first acoustic impedance layer 107 is formed of a material having relatively low acoustic impedance, which may be a relatively soft material, such as silicon oxide ($SiO_x$) or silicon nitride ($SiN_x$), where x is an integer, carbon-doped silicon oxide (CDO), or chemical vapor deposition silicon carbide (CVD SiC), for example. The second acoustic impedance layer 108 is formed of a material having relatively high acoustic impedance, which may be a relatively hard material, such as tungsten (W) or molybdenum (Mo), for example. The first and second acoustic impedance layers 107 and 108 may be formed with respective thicknesses corresponding to a quarter wavelength of a natural resonance frequency of acoustic resonator 100B.

In various embodiments, the perimeter DBR may include other numbers of acoustic impedance layers and/or acoustic impedance layer pairs, without departing from the scope of the present teachings. For example, the perimeter DBR may be formed of a single quarter-wavelength layer (e.g., having relatively low acoustic impedance), or of multiple pairs of acoustic impedance layers. When there are additional acoustic impedance layer pairs in the perimeter DBR, each pair likewise includes a first acoustic impedance layer formed of low acoustic impedance material stacked on a second acoustic impedance layer formed of high acoustic impedance material. Various illustrative fabrication techniques of acoustic mirrors are described by in U.S. Pat. No. 7,358,831 (Apr. 15, 2008), to Larson III, et al., which is hereby incorporated by reference in its entirety.

Notably, FIG. 1B depicts a single acoustic resonator 100B. If the acoustic resonator 100B were to be included in a device with additional acoustic resonators, for example, in a filter including 5-10 acoustic resonators, the first and second acoustic impedance layers 107 and 108 of the perimeter DBR 106 would need to be electrically isolated from perimeter DBRs of the other acoustic resonators, as would be apparent to one of ordinary skill in the art. For example, a trench or other isolating means may be etched off around the perimeter DBR 106 down to the substrate 105.

The amount of acoustic isolation provided by perimeter DBR 106 generally depends on the contrast between the acoustic impedances of adjacent acoustic impedance layers, with a greater amount of contrast creating better acoustic isolation. In some embodiments, the perimeter DBR 106 is formed in pairs of dielectric materials having contrasting acoustic impedances. For example, the first acoustic impedance layer 107 (along with any additional odd acoustic impedance layers) may be formed of silicon oxide (SiO$_x$), where x is an integer, while the second acoustic impedance layer 108 (along with any additional even acoustic impedance layers) paired with the first acoustic impedance layer 107 may be formed of tungsten (W) or molybdenum (Mo). In another example, the first acoustic impedance layer 107 (along with any additional odd acoustic impedance layers) may be formed of carbon-doped silicon oxide (CDO), while the second acoustic impedance layer 108 (along with any additional even acoustic impedance layers) paired with the first acoustic impedance layer 107 may be formed of silicon nitride (SiN$_x$), where x is an integer. A benefit of this pairing of materials is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. Of course, the low and high acoustic impedance materials forming the stacked layers of the perimeter DBR 106 may vary without departing from the scope of the present teachings.

The substrate 105 may be formed of a material compatible with semiconductor processes, such as silicon (Si), gallium arsenide (GaAs), indium phosphide (InP), glass, sapphire, alumina, or the like, for example. Various illustrative fabrication techniques for an air cavity in a substrate are described by U.S. Pat. No. 7,345,410 (Mar. 18, 2008), to Grannen et al., which is hereby incorporated by reference in its entirety.

The first and second planarization layers 120 and 130 may be formed of borosilicate glass (BSG), for example. The first planarization layer 120 is not strictly required for the functioning of FBAR 100B, but its presence can confer various benefits. For instance, the presence of first planarization layer 120 tends to improve the structural stability of FBAR 100B, may improve the quality of growth of subsequent layers, and may allow bottom electrode 115 to be formed without its edges extending beyond the air cavity 110. Further examples of potential benefits of planarization are presented in U.S. Patent App. Pub. No. 2013/0106534 to Burak et al., which is hereby incorporated by reference in its entirety. The bottom and top electrodes 115 and 135 may be formed of one or more electrically conductive metal materials, such as tungsten (W), molybdenum (Mo), copper (Cu) or aluminum (Al). The bottom and top electrodes 115 and 135 electrodes may be formed of the same or different materials.

Notably, the use of a high acoustic impedance material in the second planarization layer 130, for example, tends to produce a vertical modal energy distribution across the stack in the region of collar 140 that matches more closely a vertical modal energy distribution across the stack in the active region. This allows a closer match between a vertical distribution of the modal energy distribution of electrically excited piston mode in the active region and a vertical modal energy distribution of the eTE mode in the region of collar 140 at the frequencies around the series resonance frequency Fs of the acoustic resonator 100B. The eTE mode may then decay exponentially in the direction away from the collar/membrane interface without coupling to other propagating modes supported by the acoustic resonator 100B structure. This in turn may result in overall reduced scattering loss in the collar region and may produce significant improvements in Rp. Moreover, use of higher acoustic impedance materials in the collar 140 and the passivation layer may also contribute to improved performance for similar reasons.

The collar 140 may be formed of a dielectric material of predetermined thickness and width that substantially surrounds the main membrane region. The dielectric material may be silicon dioxide (SiO$_2$), silicon nitride (SiN), silicon carbide (SiC), aluminum nitride (AlN), zinc oxide (ZnO), aluminum oxide (Al$_2$O$_3$), diamond, diamond like carbon (DLC), or lead zirconium titanate (PZT), for example. The frame 145 may be formed of one or more conductive or dielectric materials, such as W, Mo, Cu, SiO$_2$, SiN, AlN, ZnO, Al$_2$O$_3$, DLC, or SiC, for example. The piezoelectric layer 125 may be formed of a thin film of piezoelectric material, such as ZnO, AlN or PZT, for example.

Of course, other materials may be incorporated into the above and other features of acoustic resonator 100B without departing from the scope of the present teachings.

A double-headed arrow 112 indicates a main membrane region, or active region, of the acoustic resonator 100B, and dotted vertical lines indicate a boundary of the main membrane region. This boundary coincides with the edge of the top electrode 135, except on connecting side 101, where the top electrode 135 extends beyond the boundary of the main membrane region. Double-headed arrows 114 and 116 indicate respective collar and frame regions of acoustic resonator 100B, and corresponding dotted vertical lines indicate boundaries of these regions. When viewed from a top angle, such as that of FIG. 1A, the above regions and their boundaries may have an apodized shape. As illustrated in FIG. 1B, the collar 140 has an inner edge that is substantially aligned with the boundary of the main membrane region, and the frame 145 has an outer edge that is substantially aligned with the same boundary.

In the example of FIG. 1B, the main membrane region does not include the full extent of overlap between bottom and top electrodes 115 and 135 and piezoelectric layer 125, because the illustrated right side of top electrode 135 is a connecting edge and it is not intended to modify the characteristic electrical impedance at an operating frequency range of the acoustic resonator 100B in any significant way. However, an overlap between the bottom electrode 115, the piezoelectric layer 125, the top electrode 135 and the substrate 105 in the top electrode connecting edge, usually referred to as dead-FBAR, may cause significant acoustic energy loss since piston mode is electrically excited all the way to the outer perimeter of the air cavity 110 in that region, where it may couple to propagating modes supported by the substrate 105 region. The presence of the collar 140 in that region may minimize that unwanted energy loss by mass-loading the top-electrode connecting edge, which in turn significantly lowers the amplitude of electrically excited piston mode at an outer edge of the air cavity 110.

During typical operation of acoustic resonator 100B, as a part of a ladder filter, for instance, an input electrical signal may be applied to an input terminal of the bottom electrode 115 and the top electrode 135 may be connected to the output terminal. The input electrical signal may include a time-varying voltage that causes vibration in the main membrane region. This vibration in turn produces an output electrical signal at an output terminal of the top electrode 135. The input and output terminals may be connected to bottom and top electrodes 115 and 135 via connection edges that extend away from the main membrane region as shown in FIG. 1B. For example, from a top view, these connection edges may be seen to extend outside of an apodized pentagon shape, such as that illustrated in FIG. 1A. The input and output terminals of acoustic resonator 100B may be connected to appropriate terminals of other acoustic resonators forming the ladder filter, for instance.

The electrically excited piston mode is terminated at the edge of top electrode 135. This structural discontinuity at the edge of top electrode 135 presents a significant discontinuity in cutoff frequencies between the main membrane and peripheral regions, and it causes excitation of lateral modes in both the main membrane and peripheral regions to facilitate continuity of appropriate particle velocity and stress components at the interface between these regions. This can lead to undesirable scattering of acoustic energy from the piston mode and the resulting degradation of electrical response of acoustic resonator 100B. Collar 140, however, provides mass loading which lowers the cutoff frequency outside the main membrane region, producing a more laterally uniform cutoff frequency profile across acoustic resonator 100B. Similarly, frame 145 suppresses electrically excited piston mode in the frame region, and it reflects and otherwise resonantly (exponentially) suppresses propagating (evanescent and complex) eigenmodes in lateral directions, with both effects simultaneously improving operation of acoustic resonator 100B. In other words, performance improvement of acoustic resonator 100B is facilitated by at least one of a cut-off frequency mismatch and an acoustic impedance mismatch between the frame region and other portions of the main membrane region which is produced by frame 145.

Meanwhile, the perimeter DBR 106 generally mitigates acoustic losses in the vertical direction (y-dimension in the coordinate system depicted in FIG. 1B) of the acoustic resonator 100B. The principle of operation of the perimeter DBR 106 relies on the fact that, due to destructive interference of an incident acoustic wave, its total amplitude decays exponentially in the direction of propagation through the stack (in this case away from the interface between bottom electrode 115 and first acoustic impedance layer 107). In general, such beneficial exponential decay of wave amplitude is only possible if the thicknesses of the first and second acoustic impedance layers 107 and 108 (and any additional acoustic impedance layers) comprising perimeter DBR 106 are equal to or close to equal to an odd multiple of the quarter wavelength of an incident acoustic wave. At the bottom of the perimeter DBR stack (in this case at the interface between second acoustic impedance layer 108 and the substrate 105), the wave amplitude is small, thus yielding negligible radiation of acoustic energy into the substrate 105. In other words, the acoustic energy incident upon the perimeter DBR 106 is being reflected back with only small transmission of acoustic energy into the substrate 105. Notably, the beneficial reflectivity properties of the perimeter DBR 106 are in general possible for a limited range of frequencies, a specific polarization and a limited range of propagation angles of an incident wave. In practical cases when the range of frequencies is given by a bandwidth of a filter and multiple eigenmodes are being excited in the active region, the optimal thicknesses of the various acoustic impedance layers are found numerically and experimentally.

As mentioned above, the first acoustic impedance layer 107 has a comparatively low acoustic impedance and is provided beneath the bottom electrode 115 and the first planarization layer 120, and the second acoustic impedance layer 108 has a comparatively high acoustic impedance is disposed beneath the first acoustic impedance layer 107. As mentioned above, the use of two acoustic impedance layers (e.g., the first and second acoustic impedance layers 107, 108) is merely illustrative, and the perimeter DBR 106 may comprise more than two acoustic impedance layers, or a single acoustic impedance layer. Notably, a plurality of acoustic impedance layers of alternating (e.g., stacked low-high-low-high) acoustic impedances may be provided around the perimeter of the cavity 110. The number of acoustic impedance layers provided for the perimeter DBR is determined by a tradeoff between expected reflection performance (the more layers the better) and cost and processing issues (the fewer layers the cheaper and more straightforward mirror growth and post-processing). Furthermore, depending on the acoustic impedance of the substrate 105, the second acoustic impedance layer 108 may be foregone, with the first acoustic impedance layer 107 being disposed directly over the substrate 105.

The amount of acoustic isolation of the excited eigenmodes provided by the perimeter DBR 106 also depends on the contrast between the acoustic impedances of the adjacent acoustic impedance layers, with a greater amount of contrast creating better acoustic reflection of the vertical component of the eigenmodes. In some embodiments, the first and second acoustic impedance layers 107 and 108 are formed of a pair of dielectric materials having contrasting acoustic impedances. One example of such a pair of dielectric materials comprises alternating layers of sputter-deposited silicon carbide (SiC) and plasma enhanced chemical vapor deposited (PECVD) SiC. Notably, the sputter-deposited SiC layer has a comparatively high acoustic impedance and the PECVD SiC layer has a comparatively low acoustic impedance. As such, according to one embodiment, the first acoustic impedance layer 107 comprises PECVD SiC and the second acoustic impedance layer 108 comprises sputter-deposited SiC. Another example of such a pair of dielectric layers is carbon-doped silicon oxide (CDO) and silicon nitride. As such, according to another representative embodiment, the first acoustic impedance layer 107 comprises CDO and the second acoustic impedance layer 108 comprises silicon nitride.

The perimeter DBR 106 may be formed before the formation of the cavity 110 and the subsequent layers of the acoustic resonator 100B. In particular, the layers of the perimeter DBR 106 are provided over the substrate 105 using selected materials deposited by known methods. For example, the second acoustic impedance layer 108 may be formed over the substrate 105, and the first acoustic impedance layer 107 is formed over the second acoustic impedance layer 108. Alternatively, the first acoustic impedance layer 107 may be formed over the substrate 105 directly. Still alternatively, additional acoustic impedance layers (not shown) may be provided between the second acoustic impedance layer 108 and the first acoustic impedance layer 107. In all embodiments, however, the first acoustic impedance layer 107, which has comparatively low acoustic impedance, is provided beneath the bottom electrode 115. The layers of the perimeter DBR 106 can be fabricated using various known methods, an example of which is described in U.S. Pat. No. 7,358,831 (Apr. 15, 2008) to Larson, III, et al., the disclosure of which is hereby incorporated by reference in its entirety.

In general, the main membrane region of FBAR 100B is defined by the presence of air (essentially zero acoustic impedance material) at both top and bottom boundaries. Therefore vertical stress components are zero at these boundaries. Similarly, through proper selection of materials in the perimeter DBR 106, the first acoustic impedance layer 107 may have very low acoustic impedance compared to the bottom electrode 115, which may also lead to a lowered vertical stress at the boundary between the bottom electrode 115 and the first acoustic impedance layer 107. Such a lowered stress condition is however only possible when thickness of the first acoustic impedance layer 107 is reasonably close to an odd multiple of the quarter wavelength of the fundamental eigenmode (e.g., TE1) for which the perimeter DBR 106 is being designed. Adding more acoustic impedance layers to the perimeter DBR 106 further lowers the vertical stress at the interface between the bottom electrode 115 and the first acoustic impedance layer 107, thus allowing for closer approximation of an ideal zero-stress condition.

However, as mentioned above, while lower vertical stress for the TE1 mode is realized by the selection of the thickness of the first acoustic impedance layer 107, for other modes which are excited either electrically or mechanically (by modal coupling at the lateral edges of the membrane) that must not necessarily be the case and leakage of these modes through the perimeter DBR 106 may be actually enhanced (leading to lesser than expected energy confinement). For instance, presence of relatively thick first acoustic impedance layer 107 with low acoustic impedance generally lowers the cut-off frequency of the second order thickness shear mode TS2, which in turn increases the shear component in the eTE1 mode at the parallel resonant frequency Fp resulting in weaker coupling of eTE1 modes supported by the collar 140 on either side of the cavity 110 edge. That weaker coupling causes stronger excitation of propagating modes and increased radiative loss, as described above in relation to collar operating principles. In other words, proximity of TS2 resonance to TE1 resonance in the perimeter DBR 106 region may increase lateral leakage of acoustic energy. To address that problem, a thinner than quarter wavelength first acoustic impedance layer 107 may be used, which in turn may adversely reduce overall reflectivity of perimeter DBR 106 in vertical direction. The proper balance between these two leakage mechanisms is usually determined by numerical simulations and experiments.

In general, the depth of the cavity 110 is determined by the etch properties of the sacrificial material and by possible downward bowing of the released membrane (i.e., layers of the acoustic resonator 100B disposed over the cavity 110) in the case of residual compressive stress in the layers of the membrane being present. Usually deeper cavities are more beneficial from the membrane release process point of view, but they also yield somewhat more difficult initial etch process. If the above mentioned features of the release process require deeper cavities than the thickness of the first acoustic impedance layer 107, one can increase the depth of the cavity 110 by continued etching the second acoustic impedance layer 108 and the substrate 105 until required distance between bottom electrode 115 and bottom of the cavity 110 is obtained. In various embodiments, a thickness of the acoustic reflector 106 may be substantially the same as the depth of the cavity 110, less than the depth of the cavity 110, or greater than the depth of the cavity 110, without departing from the scope of the present teachings.

The first and second acoustic impedance layers 107 and 108 have thicknesses in the range of approximately 1000 Å to approximately 50000 Å, respectively, depending on the material used and the frequency operating range of the filter. As mentioned above, the total thickness of all acoustic impedance layers comprising the perimeter DBR 106 is substantially equal to one quarter-wavelength of the fundamental eigenmode in the selected material and excited at the selected operational frequency (e.g., series resonance frequency). For example, if the first acoustic impedance layer 107 comprises CDO for operation at 800 MHz (series resonance frequency), the first acoustic impedance layer 107 has a thickness of approximately 1.2 µm. In this example, second acoustic impedance layer 108 may comprise SiN, having a thickness of approximately 3.2 µm for operation at 800 MHz. Notably, the thickness of all acoustic impedance layers of the perimeter DBR 106 can be selected to be odd-multiple (e.g., 5) quarter-wavelengths of the fundamental acoustic resonator eigenmode in the selected material (e.g., if one quarter-wavelength layer is too thin for practical processing).

Figure 1C:
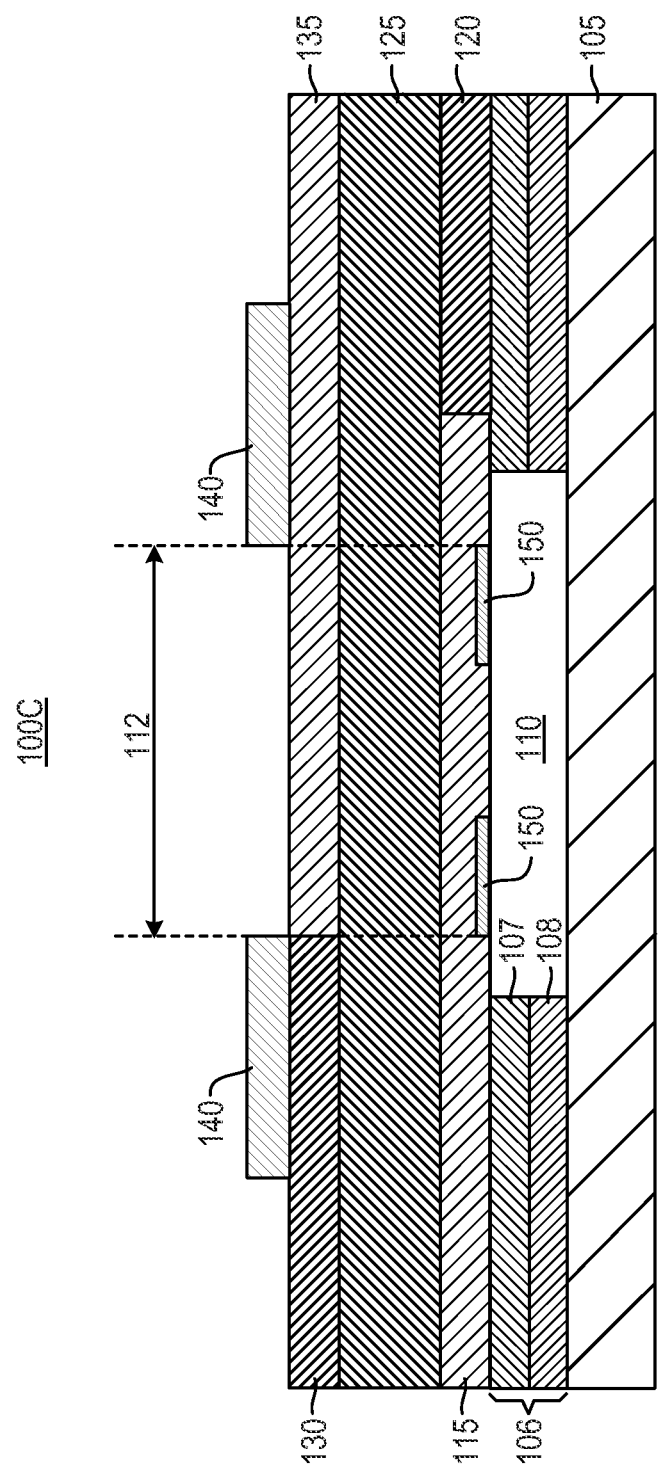
FIG. 1C is a cross-sectional view of an acoustic resonator according to another representative embodiment.
Figure 1D:
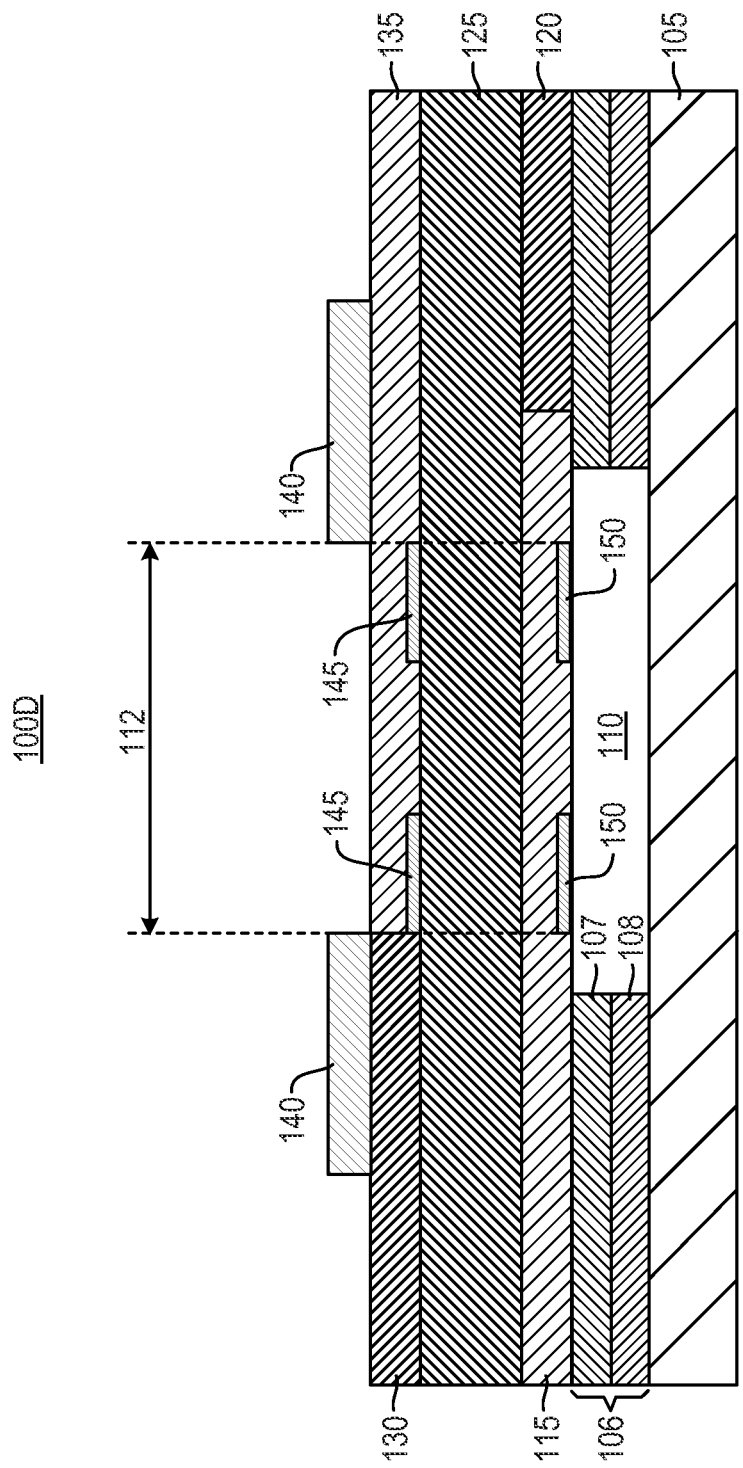
FIG. 1D is a cross-sectional view of an acoustic resonator according to another representative embodiment.
Figure 1E:
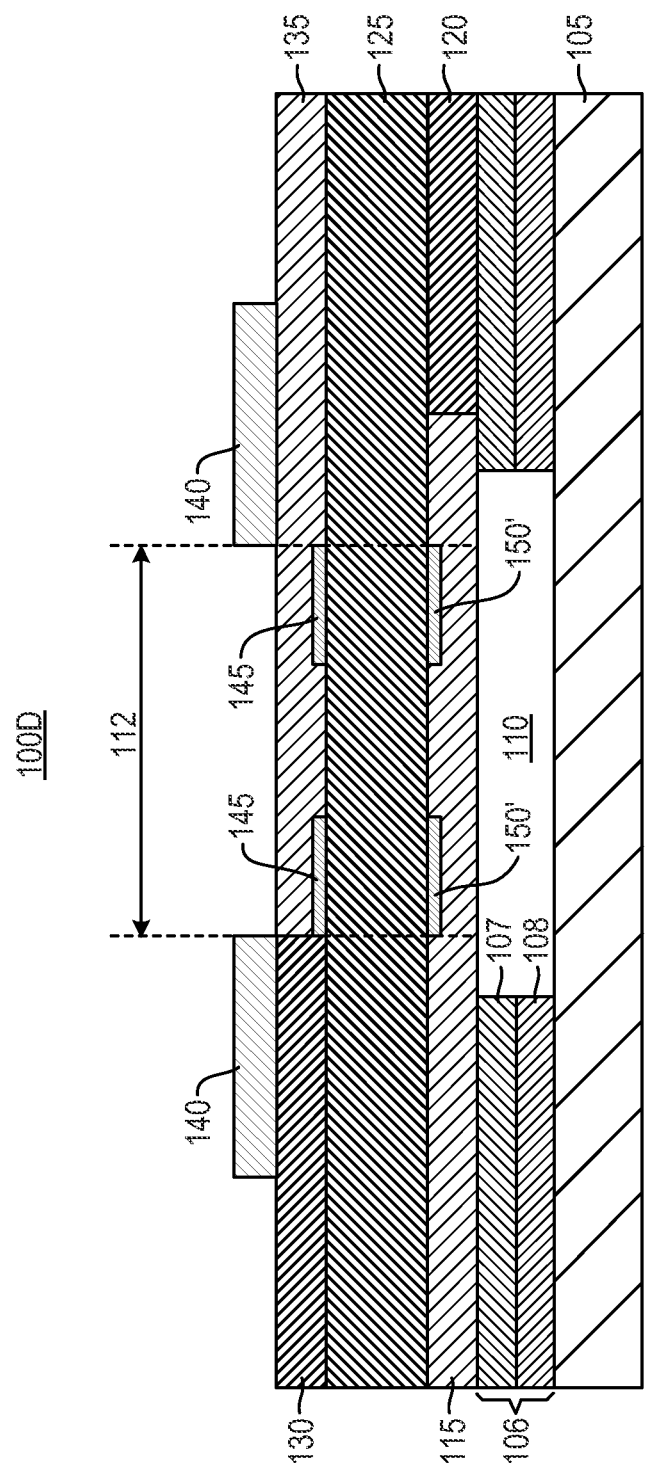
FIG. 1E is a cross-sectional view of an acoustic resonator according to another representative embodiment.

Referring to FIGS. 1C, 1D, and 1E depict variations of the acoustic resonator 100B. In particular, in FIG. 1C, acoustic resonator 100C is substantially the same as acoustic resonator 100B, except that frame 145 is omitted and replaced by a frame 150 located at a bottom portion of bottom electrode 115. In FIG. 1D, acoustic resonator 100D is substantially the same as acoustic resonator 100B, except that frame 150 is provided at a bottom portion of bottom electrode 115, in addition to frame 145. In FIG. 1E, acoustic resonator 100E is substantially the same as acoustic resonator 100D, except that frame 150 is replaced by a frame 150', which is located at a top portion of bottom electrode 115 instead of a bottom portion. The frames in acoustic resonators 100C through 100E provide benefits similar to frame 145 of acoustic resonator 100B, although their performance and manufacturing processes will vary somewhat from acoustic resonator 100B due to the different locations of the frames. Some general tradeoffs of different frame configurations are described, for instance, in the above cited U.S. patent application Ser. No. 13/660,941.

Figure 1F:
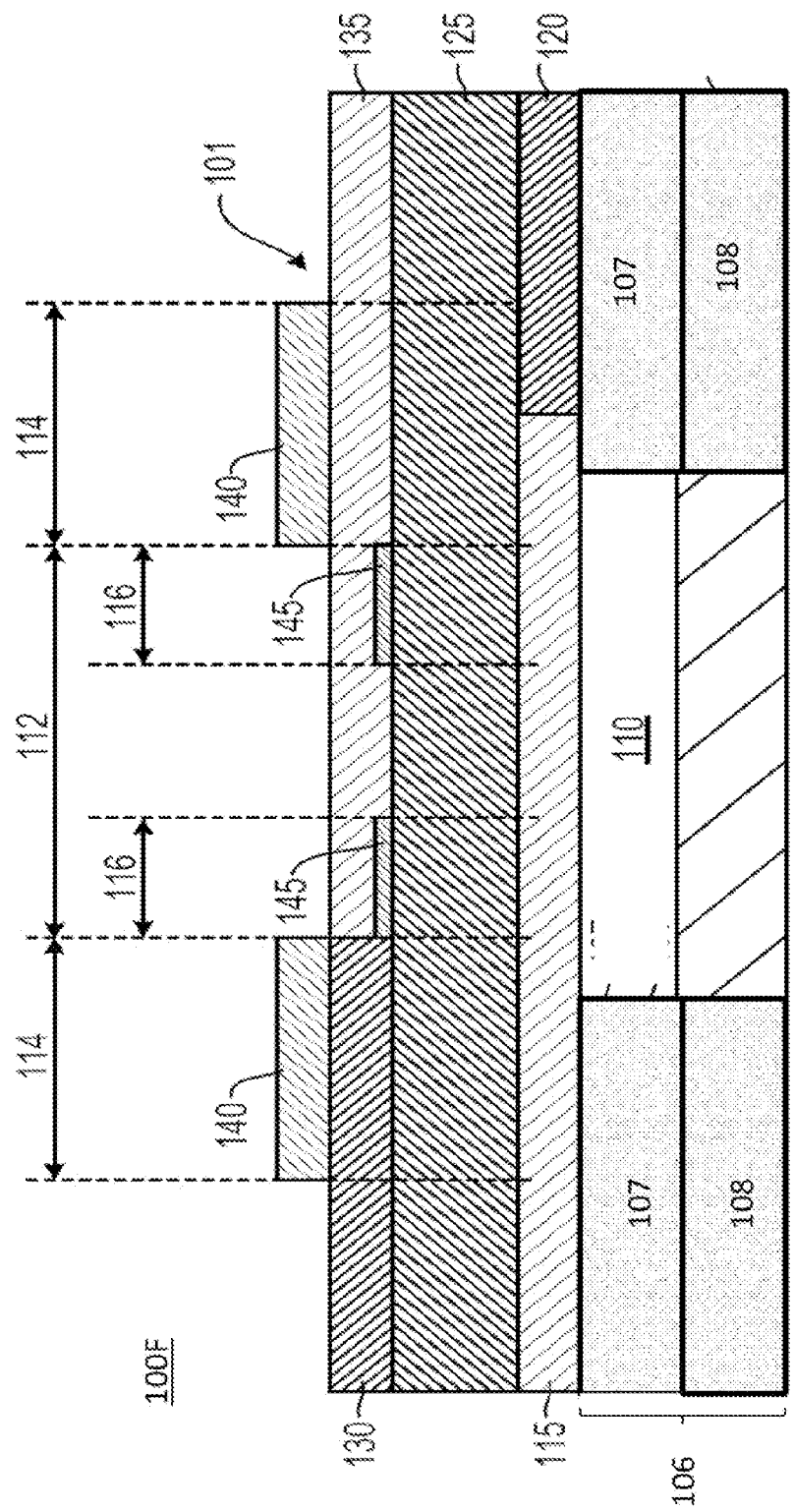
FIG. 1F is a cross-sectional view of an acoustic resonator according to another representative embodiment.

Referring to FIG. 1F, acoustic resonator 100F, which may be an FBAR, for example, comprises substrate 105 defining air cavity 110. A perimeter acoustic reflector, indicated by perimeter distributed Bragg reflector (DBR) 106 (also referred to as an acoustic reflector herein), is formed around a perimeter of the cavity 110 over a top surface of the substrate 105. The perimeter DBR 106 comprises first acoustic impedance layer 107 and second acoustic impedance layer 108. Many aspects of acoustic resonator 100F are substantively the same as those of acoustic resonators 100B-100E (e.g., elements of the acoustic stack, collars, frames, and their locations), and are not repeated presently. As can be seen in FIG. 1F, the perimeter DBR 106 has a thickness that is greater than the depth of the air cavity 110.

FIGS. 2A through 2D are cross-sectional views of acoustic resonators 200A through 200D, respectively, according to other representative embodiments. The acoustic resonators 200A through 200D are substantially the same as acoustic resonators 100B through 100E, respectively, except that collar 140 is omitted and a collar 240 is instead formed between bottom electrode 115, 215 or 215' and piezoelectric layer 125. The collar 240 provides benefits similar to the collar 140 of acoustic resonators 100B through 100E, although its performance and manufacture varies somewhat due to the different location of the collar 240.

Figure 2A:
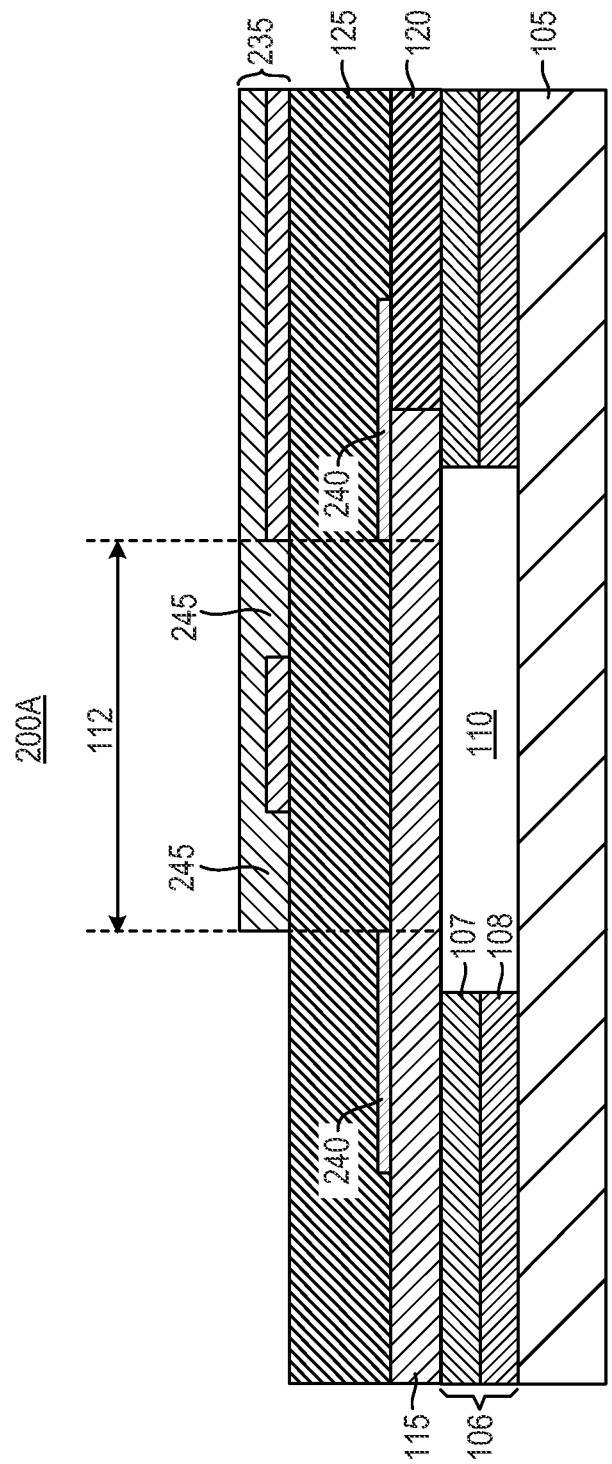
FIG. 2A is a cross-sectional view of an acoustic resonator according to another representative embodiment.
Figure 2B:
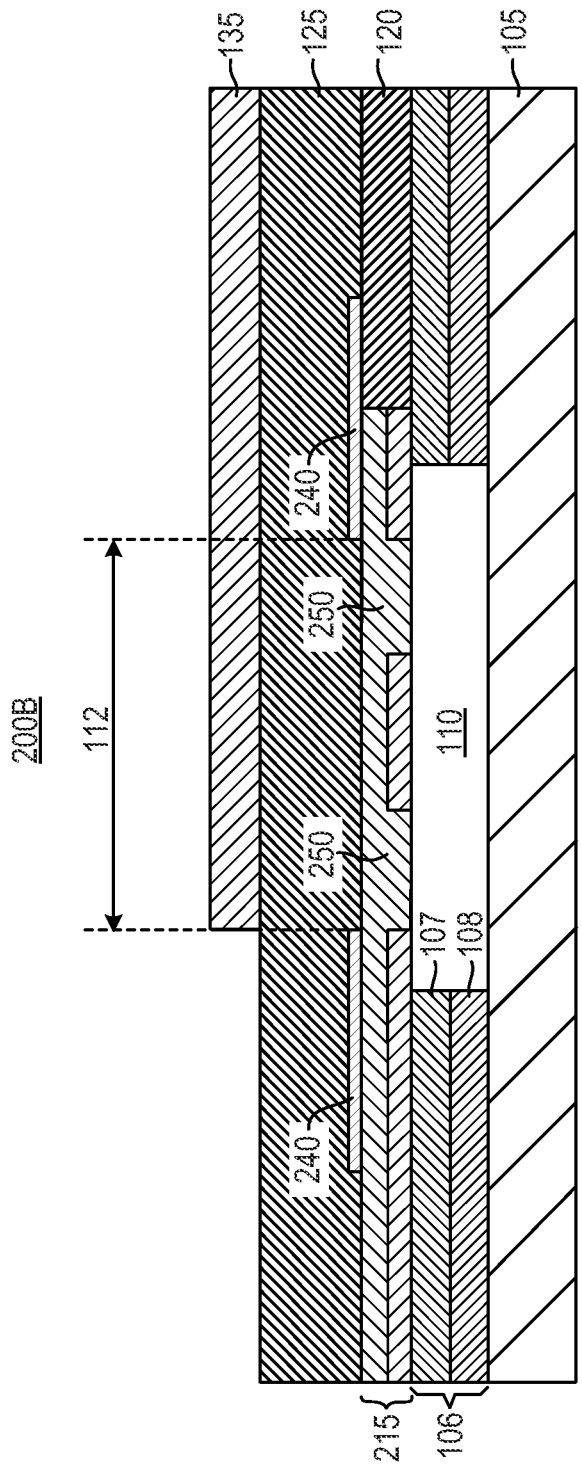
FIG. 2B is a cross-sectional view of an acoustic resonator according to another representative embodiment.
Figure 2C:
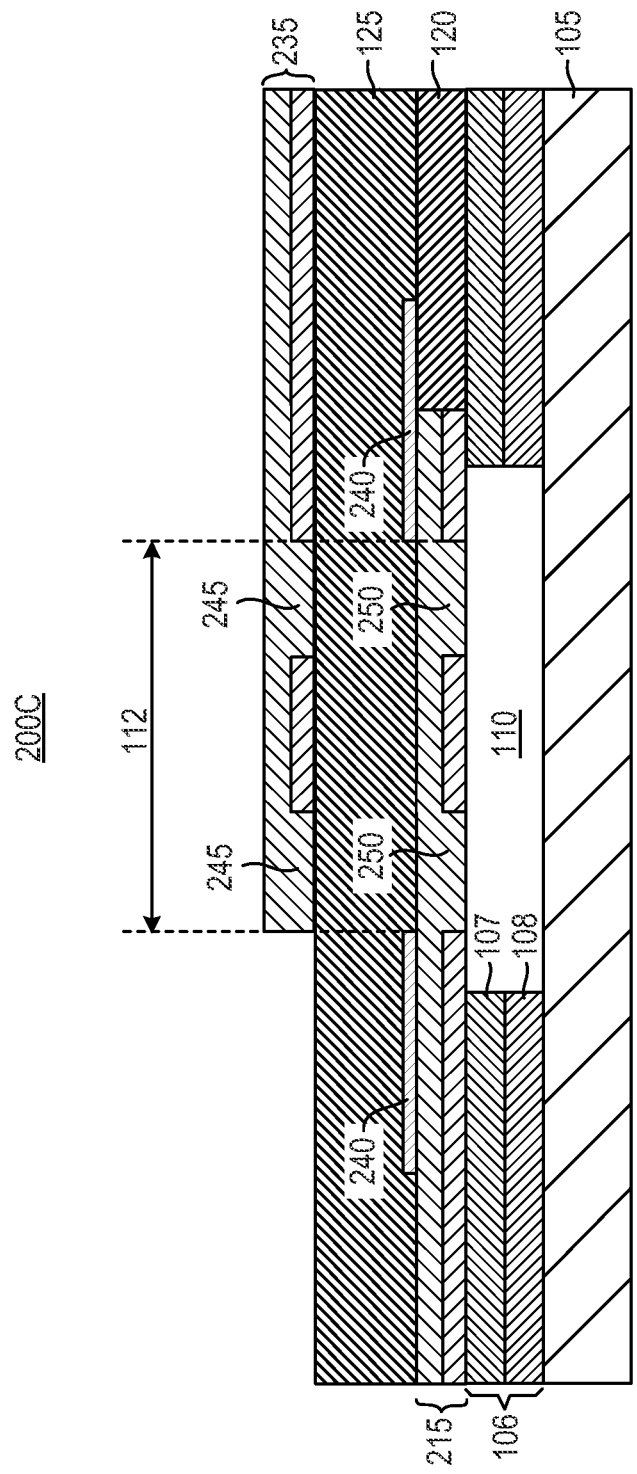
FIG. 2C is a cross-sectional view of an acoustic resonator according to another representative embodiment.
Figure 2D:
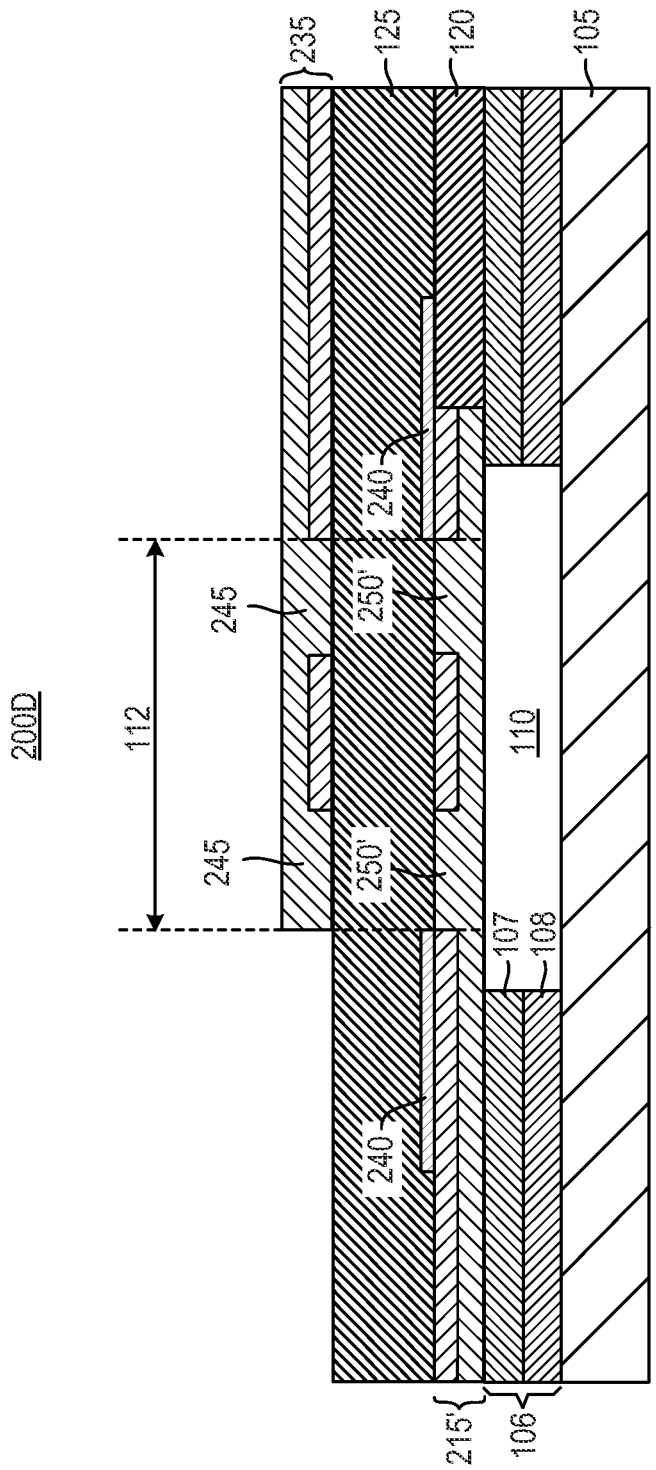
FIG. 2D is a cross-sectional view of an acoustic resonator according to another representative embodiment.

Note that for illustrative purposes, the frames 245 formed in the top electrode 235 and frames 250, 250' formed in the bottom electrode 215, 215' of the acoustic resonators 200A through 200D are constructed differently than the frames 145 of in the top electrode 135 and the frame 150, 150' formed in the bottom electrode 115, 115' of the acoustic resonators 100B through 100E, respectively, although the functionality of the frames 245, 250,250' is substantially the same as discussed above. In particular, the top electrode 235 in FIGS. 2A, 2C and 2D is a composite electrode comprising two different metal materials to provide integrated lateral features (frames 245). Likewise, the bottom electrode 215 in FIGS. 2B and 2C and the bottom electrode 215' in FIG. 2D are also composite electrodes comprising two different metal materials to provide integrated lateral features (frames 250, 250').

Generally, the frame 245 comprises an inside electrode layer formed on the piezoelectric layer 125 and an outside electrode layer formed on the inside electrode layer. The outside electrode layer is formed of a first material and the inside electrode layer is formed of the first material and a second material, where the first material effectively extends from the outside electrode layer through the second material of the inside electrode layer to provide the frame 245 (in a bottom portion of the top electrode 235). The second material may have higher sound velocity than the first material. For example, the second material may be formed of molybdenum (Mo) and the first material may be tungsten (W) or aluminum (Al), although other materials may be incorporated without departing from the scope of the present teachings. The frame 250 comprises an inside electrode layer formed beneath the piezoelectric layer 125 and an outside electrode layer formed beneath the inside electrode layer. The inside electrode layer is formed of the first material and the outside electrode layer is formed of the first and second materials, where the first material effectively extends from the inside electrode layer through the second material of the outside electrode layer to provide the frame 250 (in a bottom portion of the bottom electrode 215). Similarly, the frame 250' comprises an inside electrode layer formed beneath the piezoelectric layer 125 and an outside electrode layer formed beneath the inside electrode layer. The outside electrode layer is formed of the first material and the inside electrode layer is formed of the first and second materials, where the first material effectively extends from the outside electrode layer through the second material of the inside electrode layer to provide the frame 250' (in a top portion of the bottom electrode 215').

The frames may be realized by other types and locations of integrated lateral features formed by composite electrodes, without departing from the scope of the present teachings. Examples of composite electrodes with integrated lateral features are provided by U.S. patent application Ser. No. 13/660, 941, filed Oct. 25, 2012, which is hereby incorporated by reference in its entirety. Also, some general tradeoffs of different frame configurations are described, for instance, in the above cited U.S. patent application Ser. No. 13/663,449. Of course, the structures of the frames 245, 250 and 250' may be applied to the acoustic resonators 100B through 100E, and the structures of the frames 145, 150 and 150' may be applied to the acoustic resonators 200A through 200D, without departing from the scope of the present teachings.

FIGS. 3A through 3D are cross-sectional views of acoustic resonators 300A through 300D, respectively, according to other representative embodiments. The acoustic resonators 300A through 300D are substantially the same as acoustic resonators 100B through 100E, respectively, except that collar 140 is omitted and a collar 340 is instead formed between bottom electrode 315 and substrate 105. In other words, the collar 340 is formed below the bottom electrode 315. The collar 340 provides benefits similar to the collar 140 of acoustic resonators 100B through 100E, although its performance and manufacture varies somewhat due to the different location of the collar 340.

In the depicted embodiment, an additional first planarization layer 320' is disposed on the substrate 105 adjacent to the collar 340, providing a substantially planar upper surface on which the bottom electrode and the first planarization layer 320 are formed. The first planarization layer 320 is disposed on the additional first planarization layer 320' and the collar 340 adjacent to the bottom electrode 315, providing a substantially planar upper surface on which the piezoelectric layer 125 is formed. The collar 340 extends into a portion of the cavity 110. The first planarization layer 320 and the additional first planarization layer 320' may be formed of borosilicate glass (BSG), for example.

Figure 3A:
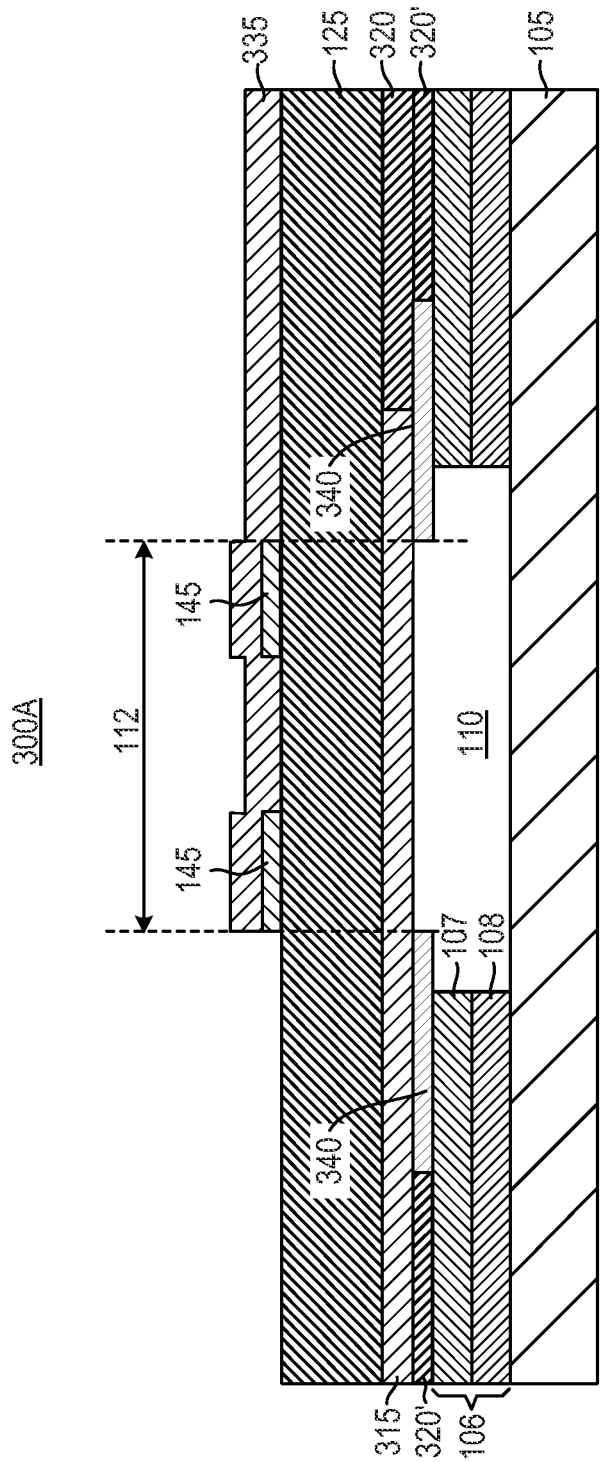
FIG. 3A is a cross-sectional view of an acoustic resonator according to another representative embodiment.
Figure 3C:
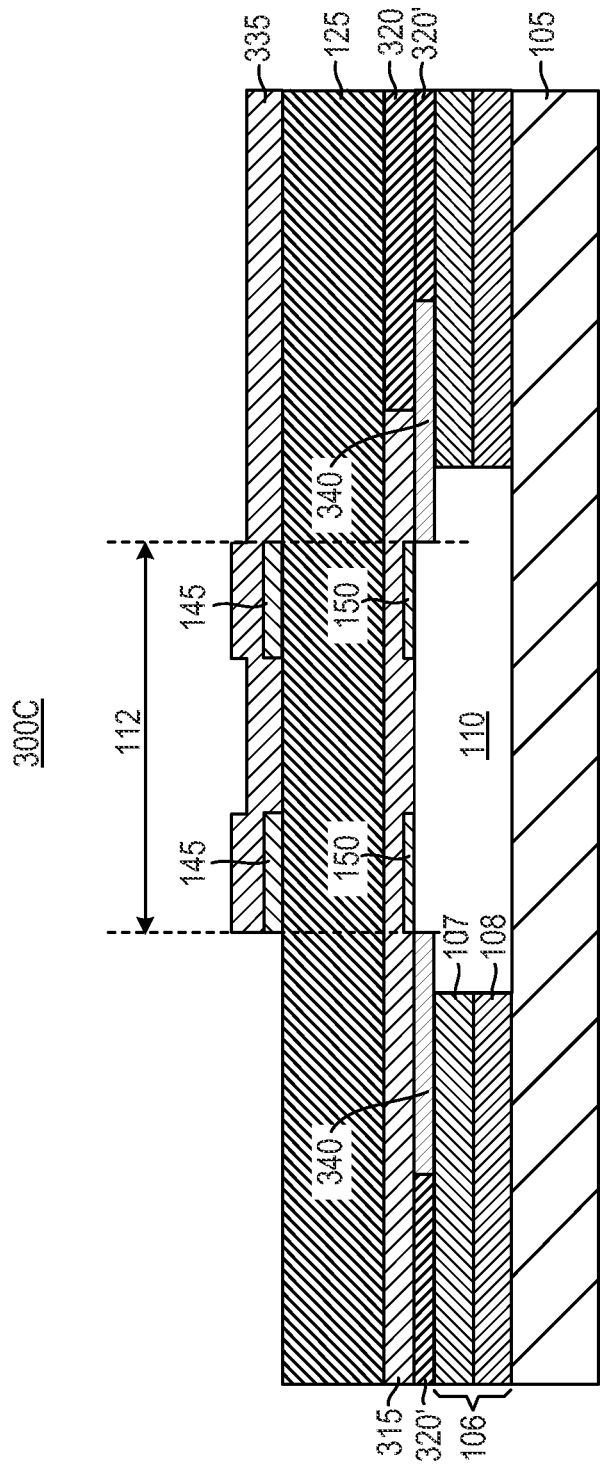
FIG. 3C is a cross-sectional view of an acoustic resonator according to another representative embodiment.
Figure 3D:
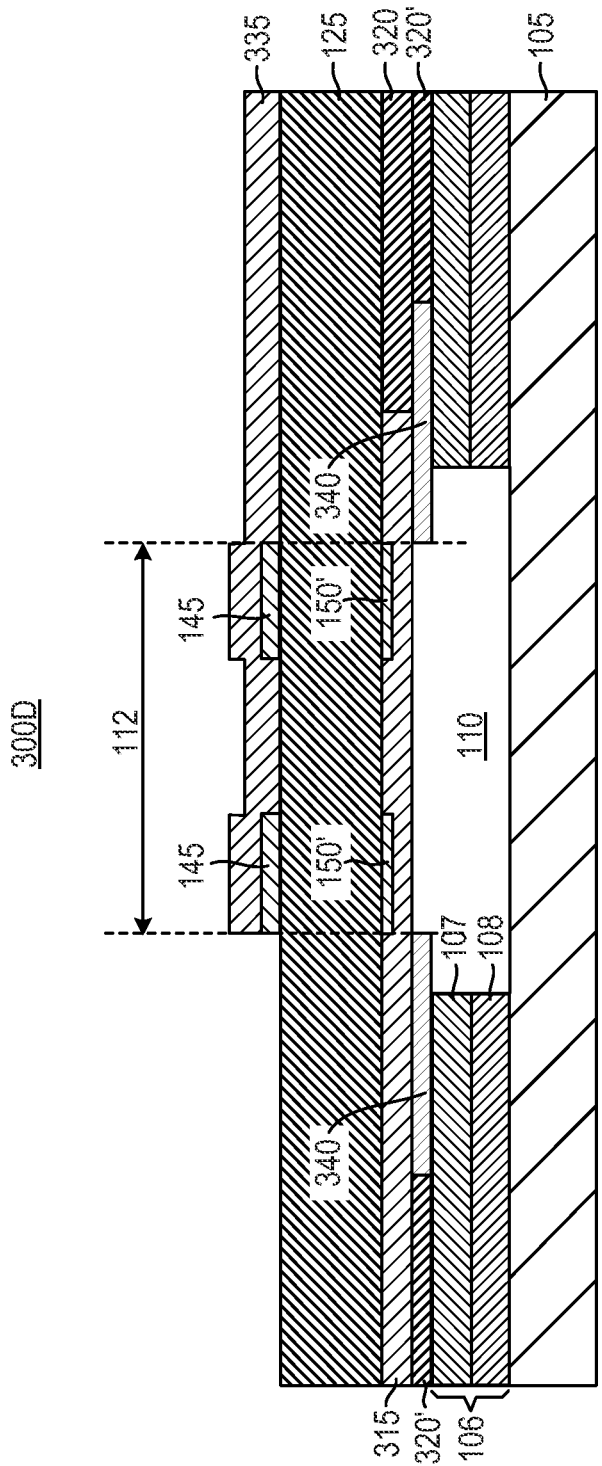
FIG. 3D is a cross-sectional view of an acoustic resonator according to another representative embodiment.

Unlike acoustic resonators 100B through 200D, in which all frames are composite frames (integrally formed within corresponding electrodes to provide planar top surfaces), the frames 145 in top electrodes 335 of the acoustic resonators 300A, 300C and 300D shown in FIGS. 3A, 3C and 3D, respectively, are add-on frames. Add-on frames result in substantially non-planar top surface profiles of the top electrode 335 in the acoustic resonators 300A, 300C and 300D. Generally, because usually only a passivation layer would be formed on top electrode 335, such non-planar profiles of the top electrode 335 would not have any significant impact on structural robustness of acoustic resonators 300A, 300C and 300D. On the other hand, frames 150 and 150' formed in the bottom electrode 315 of the acoustic resonators 300B, 300C and 300D are composite frames, resulting in substantially planar top surface profiles of the electrodes 315 and 315'. Such substantially planar top surfaces are preferable in the bottom electrode 315 and 315' in order to form a high quality, void-free piezoelectric layer 125 and top electrode 335 above the bottom electrode 315. Some additional general tradeoffs of different frame configurations are described, for instance, in the above cited U.S. patent application Ser. No. 13/663, 449. Of course, the structure of the add-on frame 345 may be applied to the acoustic resonators 100B through 100E, and the structure of the frame 145 may be applied to the acoustic resonators 300A through 300D, without departing from the scope of the present teachings. In addition, other frame configurations (add-on and composite) may be incorporated, such as addition frame configurations disclosed by U.S. patent application Ser. No. 13/781,491, filed Feb. 28, 2013, for example, without departing from the scope of the present teachings.

In alternative embodiments, the various features of the acoustic resonators 100B through 300D (e.g., perimeter DBR 106, frames 145, 150, 150', 245, 250, 205' and collars 140, 240, 340) may be provided in various combinations, without departing from the scope of the present teachings. For example, FIGS. 4A through 4C are cross-sectional views of acoustic resonators 400A through 400C, respectively, according to other representative embodiments, which include only certain features or combinations of features discussed above.

Figure 4A:
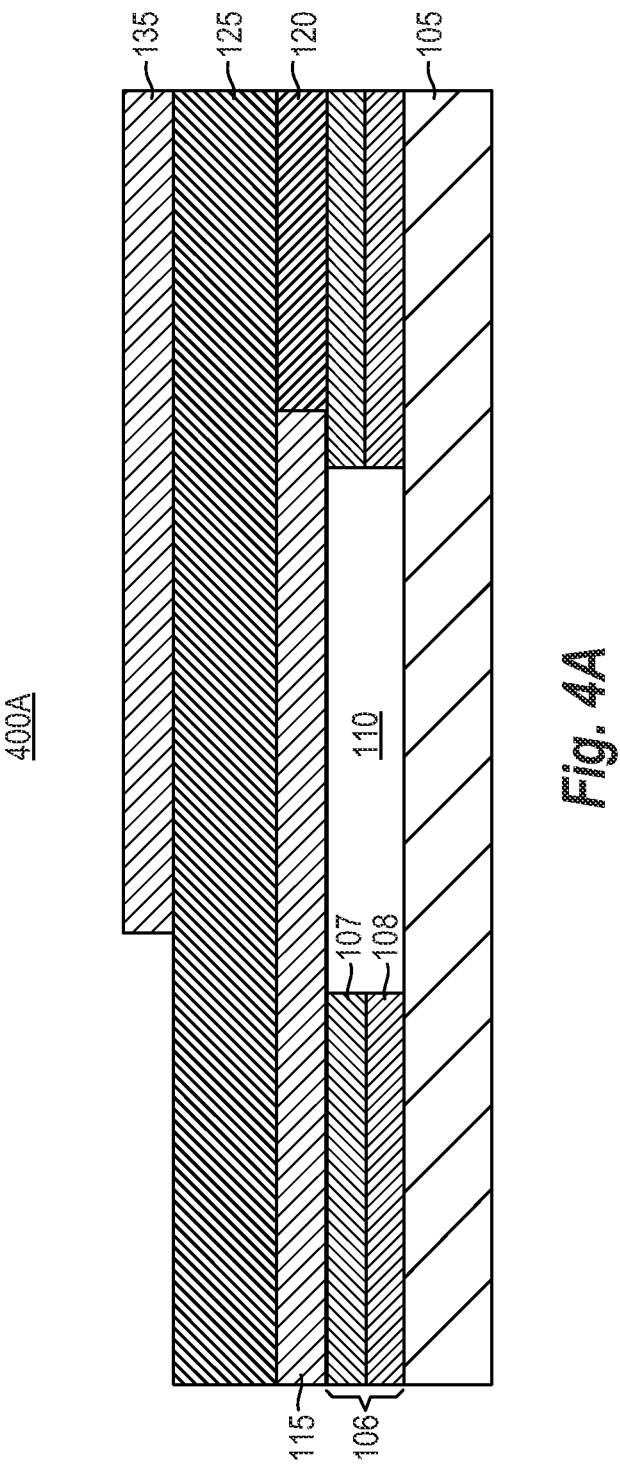
FIG. 4A is a cross-sectional view of an acoustic resonator according to another representative embodiment.
Figure 4B:
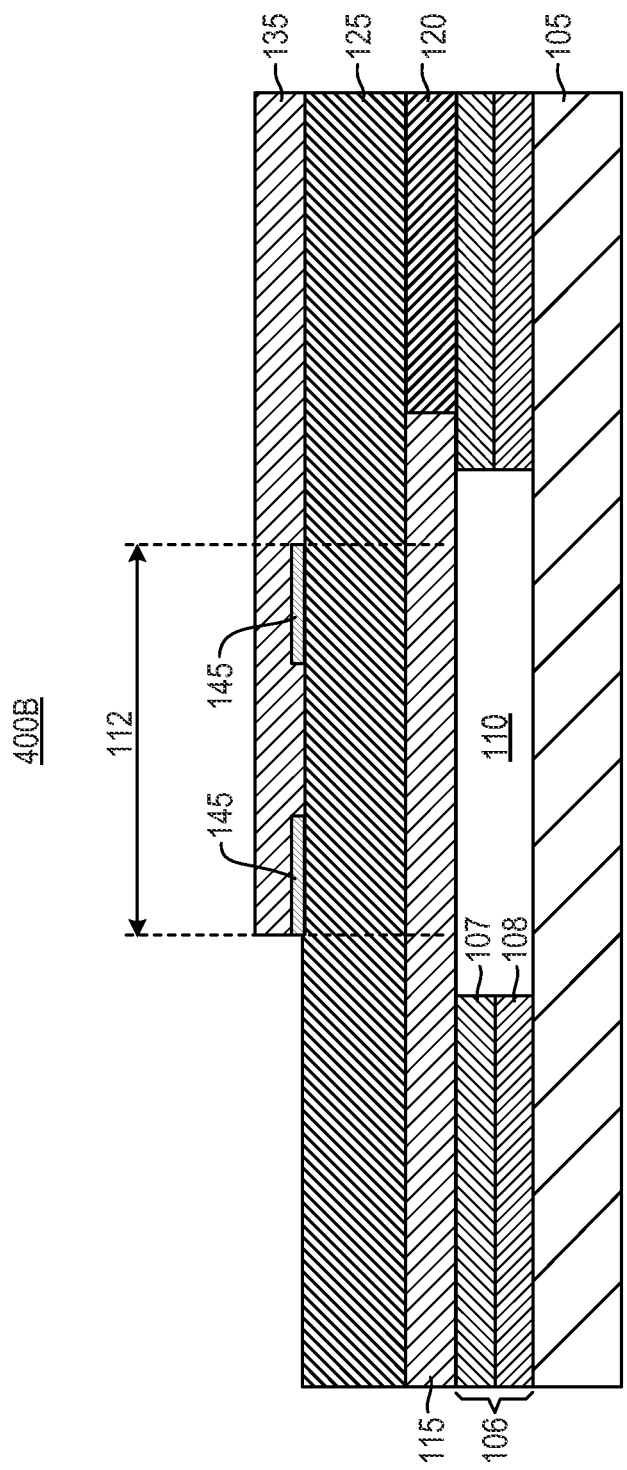
FIG. 4B is a cross-sectional view of an acoustic resonator according to another representative embodiment.
Figure 4C:
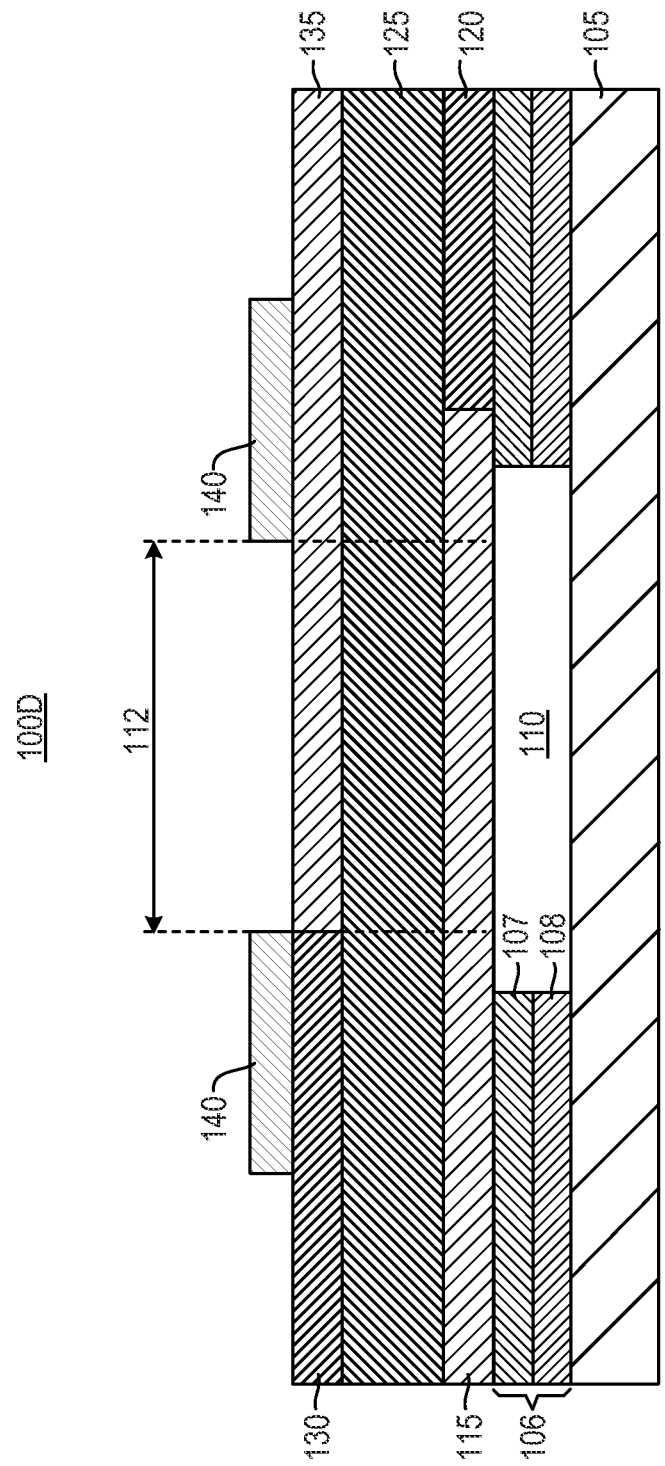
FIG. 4C is a cross-sectional view of an acoustic resonator according to another representative embodiment.

Referring to FIGS. 4A through 4C, the acoustic resonator 400A is a representative FBAR that is similar to acoustic resonator 100B, except that it includes only the perimeter DBR 106 in addition to the bare resonator (e.g., bottom electrode 115, first planarization layer 120, piezoelectric layer 125, and top electrode 135), with no frames or collars. The acoustic resonator 400B is a representative FBAR that is similar to acoustic resonator 100B, except that it includes only the perimeter DBR 106 and the frame 145 in addition to the bare resonator, with no collars. Similarly, the acoustic resonator 400C is a representative FBAR that is similar to acoustic resonator 100B, except that it includes only the perimeter DBR 106 and the collar 140 in addition to the bare resonator, with no frames. Of course, these are only examples of features, other features and other combinations of which may be incorporated without departing from the scope of the present teachings. The perimeter DBRs, the frames, and the collars provide benefits similar to those discussed above, although performance and manufacture varies somewhat due to different locations and combinations.

Figure 5A:
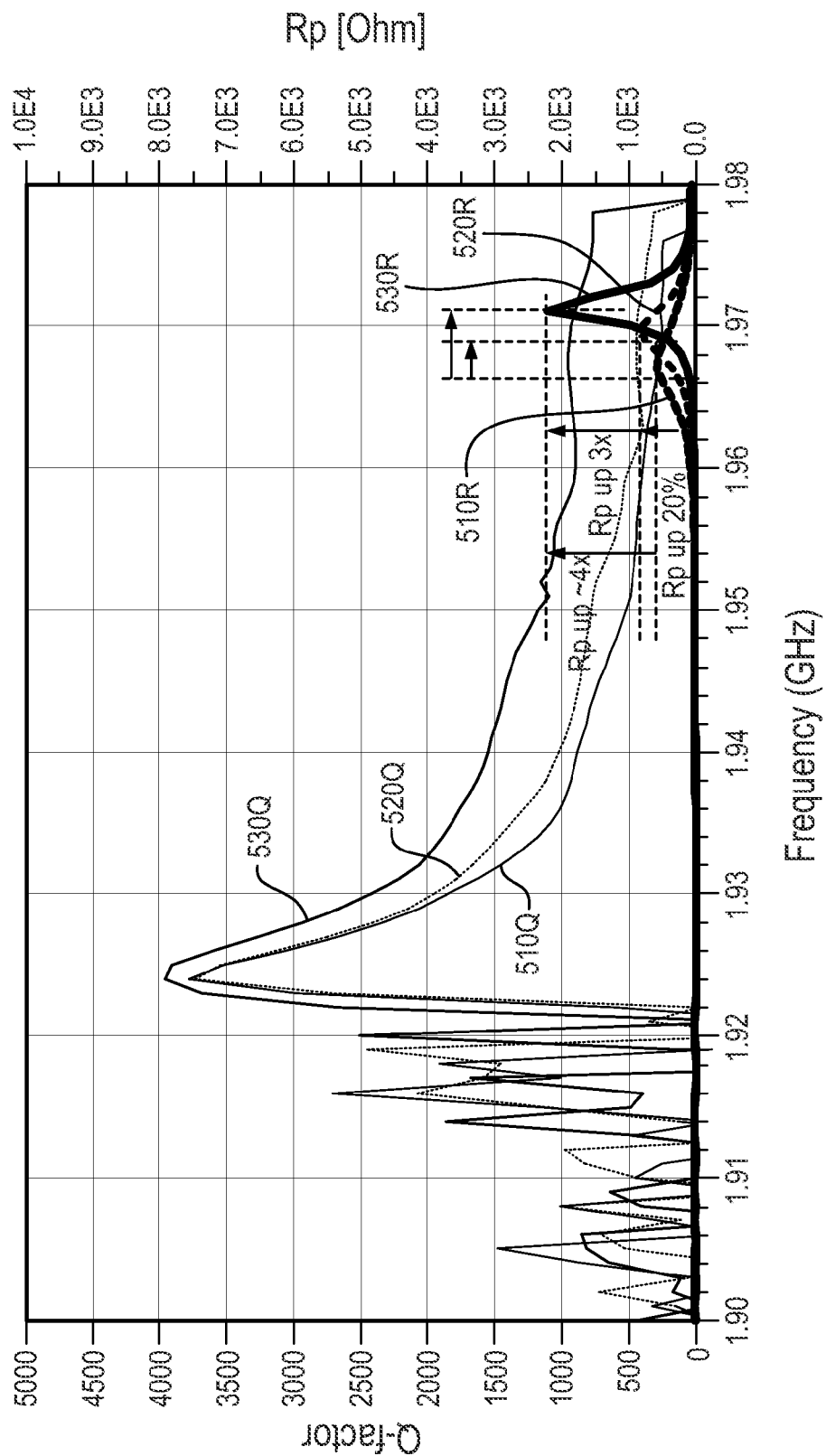
FIG. 5A is a graph illustrating the quality factor (Q-factor) and parallel resistance Rp of the acoustic resonators of FIGS. 4A and 4B, as compared to a bare-resonator.
Figure 5B:
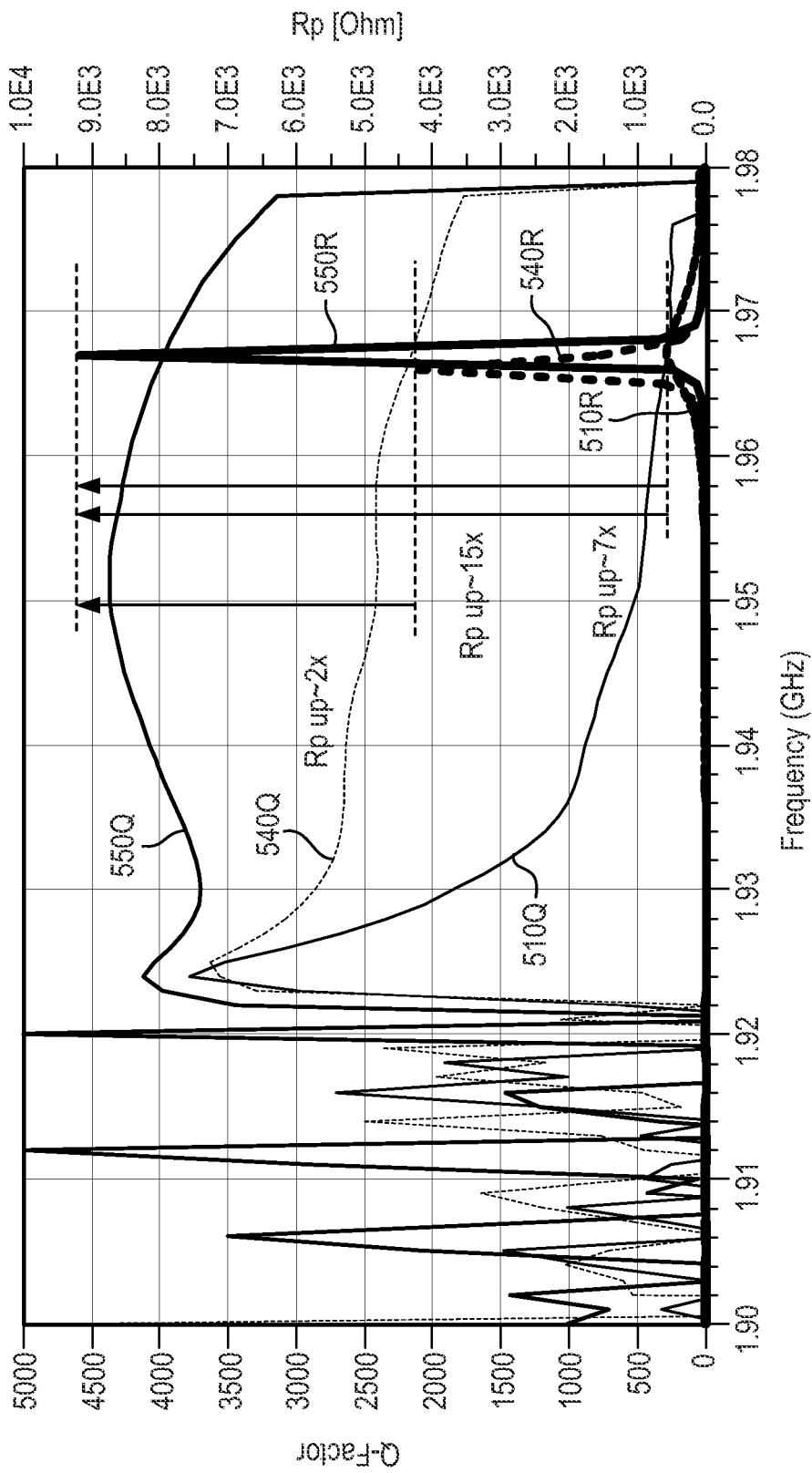
FIG. 5B is a graph illustrating the Q-factor and parallel resistance Rp of the acoustic resonators of FIGS. 4C and 1B, as compared to a bare-resonator.

FIGS. 5A and 5B are graphs illustrating the simulated Q-factor and parallel resistance Rp of acoustic resonators with and without perimeter DBR 106, collar 140 and/or frame 145, as are otherwise shown in FIG. 1B. As indicated above, the version of acoustic resonator without the perimeter DBR 106, the collar 140, the second planarization layer 130 and the frame 145 will be referred to as the bare-resonator. The purpose of theses graphs is to illustrate changes in performance of the pass-band of acoustic resonator 100B that occur as a consequence of adding the perimeter DBR 106, the collar 140 and the frame 145. Referring to FIGS. 5A and 5B, Q-factor is represented by a y-axis on the left side, and Rp is represented by a y-axis on the right side. The values of the Q-factor and Rp are shown as a function of input signal frequency on an x-axis.

In the example of FIG. 5A, the dimensions of acoustic resonator 100B have been tuned for high Rp. In particular, bottom electrode 115 is formed of Mo with a thickness of approximately 3800 Å, piezoelectric layer 125 is formed of AlN with a thickness of approximately 9300 Å, top electrode 135 is formed of Mo with a thickness of approximately 3250 Å, and a passivation layer is formed of AlN with a thickness of approximately 2000 Å.

FIG. 5A depicts three configurations, each of which is indicated by a corresponding Q-factor curve and Rp value curve. In particular, curve 510Q illustrates the Q-factor of the bare-resonator (FBAR) and curve 51 OR illustrates the Rp values of the bare-resonator. The bare-resonator design corresponds to FBAR 400A shown in FIG. 4A, but without perimeter DBR 106 and with cavity 110 formed in the substrate 105. Similarly, curves 520Q and 520R illustrate the Q-factor and the Rp values of the bare-resonator with perimeter DBR 106 (e.g., acoustic resonator 400A), and curves 530Q and 530R illustrate the Q-factor and the Rp values of the bare-resonator with perimeter DBR 106 and frame 145 (acoustic resonator 400B), respectively. More specifically, curves 510R, 520R and 530R illustrate magnitudes of complex-valued electrical impedance of the acoustic resonator. In each scenario, the perimeter DBR 106 includes a first acoustic impedance layer 107 formed of approximately 8000 Å thick plasma enhanced chemical vapor deposition silicon carbide (PECVD SiC) and a second acoustic impedance layer 108 formed of approximately 5320 Å thick tungsten (W), optimized for best parallel resistance Rp. The frame 145 is a composite frame formed of approximately 350 Å thick and approximately 3 μm wide aluminum (Al) embedded at the bottom of top electrode 135 formed of molybdenum (Mo).

At parallel resonance frequency Fp electrical impedance becomes approximately real-valued and the peak value of electrical impedance magnitude indicates parallel resistance Rp. A peak value of the Q-factor occurs for each of the curves 510Q through 530Q at about 1.924 GHz. This frequency corresponds to the series resonance frequency Fs of the respective acoustic resonators. Similarly, peak values of Rp occur for each of the curves 510R through 530R in a range of about 1.966 GHz to about 1.970 GHz. These frequencies correspond to the parallel resonance frequency Fp of the respective acoustic resonators. The bandwidths of these acoustic resonators correspond to the range of frequencies between their respective values of series resonance frequency Fs and parallel resonance frequency Fp.

Referring to FIG. 5A, it is apparent that adding the combination of features (perimeter DBR 106 and frame 145) improves performance of the acoustic resonator. For example, adding the perimeter DBR 106 (curves 520Q and 520R) increases parallel resistance Rp by about 20 percent, and also increases the coupling coefficient $Kt^2$. The increase in the coupling coefficient $Kt^2$ may be due to elimination of some of the dead-FBAR effect at the connecting edge of the top electrode 135, as discussed above. Further adding the frame 145 (curves 530Q and 530R) to the perimeter DBR 106 increases the parallel resistance Rp another three times. In particular, curve 520R indicates an Rp value of about 750 Ohms and curve 530R indicates an Rp value of about 2100 Ohms, the while curve 510R (the bare-resonator) has an Rp value of about 550 Ohms. Also, at frequencies above the series resonance frequency Fs, the acoustic resonator has significantly higher Q-factor than the bare-resonator. As should be appreciated by one of ordinary skill in the art, the Q-factor and Rp values of the acoustic resonator increase without significant degradation of the bandwidth when compared to the bare-resonator.

FIG. 5B likewise depicts three configurations, each of which is indicated by a corresponding Q-factor curve and Rp value curve. In particular, curve 510Q illustrates the Q-factor of the bare-resonator (FBAR) and curve 510R illustrates the Rp values of the bare-resonator, as in FIG. 5A. Curves 540Q and 540R illustrate the Q-factor and the Rp values of the bare-resonator with perimeter DBR 106 and collar 140 (e.g., acoustic resonator 400C), and curves 550Q and 550R illustrate the Q-factor and the Rp values of the bare-resonator with perimeter DBR 106, frame 145 and collar 140 (e.g., acoustic resonator 100B), respectively. More specifically, curves 510R, 540R and 550R illustrate magnitudes of complex-valued electrical impedance of the acoustic resonator. In each scenario, the perimeter DBR 106 includes a first acoustic impedance layer 107 formed of approximately 8000 Å thick chemical vapor deposition silicon carbide (CVD SiC) and a second acoustic impedance layer 108 formed of approximately 5320 Å thick tungsten (W), optimized for best parallel resistance Rp. The collar 140 is formed of sputtered silicon carbide (SiC), and is approximately 11.5 μm wide and approximately 4500 Å thick. The frame 145 is a composite frame formed of aluminum (Al) and molybdenum (Mo), and is approximately 350 wide and approximately 3 μm thick, similarly as for designs shown in FIG. 5A.

At parallel resonance frequency Fp electrical impedance becomes approximately real-valued and the peak value of electrical impedance magnitude indicates parallel resistance Rp. A peak value of the Q-factor occurs for each of the curves 510Q, 540Q and 550Q at about 1.924 GHz. This frequency corresponds to the series resonance frequency Fs of the respective acoustic resonators. Similarly, peak values of Rp occur for each of the curves 510R, 540R and 550R in a range of about 1.966 GHz to about 1.968 GHz. These frequencies correspond to the parallel resonance frequency Fp of the respective acoustic resonators. The bandwidths of these acoustic resonators correspond to the range of frequencies between their respective values of the series resonance frequency Fs and the parallel resonance frequency Fp.

Referring to FIG. 5B, it is apparent that adding the perimeter DBR 106 and the collar 140 to improves performance of the acoustic resonator over the bare-resonator, and adding the frame 145 to the perimeter DBR 106 and the collar 140 further improves performance. For example, adding the perimeter DBR 106 and the collar 140 (curves 540Q and 540R) increases parallel resistance Rp by about seven times, and also increases the coupling coefficient $Kt^2$, as discussed above. Further adding the frame 145 (curves 550Q and 550R) to the perimeter DBR 106 and the collar 140 increases the parallel resistance Rp another two times (or about 15 times the parallel resistance Rp of the bare-resonator). In particular, curve 540R indicates an Rp value of about 4200 Ohms and curve 550R indicates an Rp value of about 9200 Ohms, while curve 510R (the bare-resonator) has an Rp value of about 550 Ohms. Notably, the complete set of the perimeter DBR 106 and the collar 140 and the frame 145 effectively eliminates radiative loss, essentially flattening the Q-factor at and above the series resonance frequency Fs. Again, as should be appreciated by one of ordinary skill in the art, the Q-factor and Rp values of the acoustic resonator increase without significant degradation of the bandwidth when compared to the bare-resonator.

In the above-described embodiments, collars, frames and perimeter DBRs can generally be formed using conventional processing techniques, with examples including various forms of deposition, sputtering, etching, polishing, and so on. Moreover, the described embodiments and related methods of fabrication can be modified in various ways as will be apparent to those skilled in the art.

In accordance with various embodiments, a perimeter DBR combined with one or more frames and/or collars create weakly confined structures that minimize parasitic scattering of electrically excited piston mode, and therefore create acoustically lossless acoustic resonator, such as an FBAR or SMR. Generally, the collar couples piston mode and eTE mode of the main membrane region to evanescent mode of the collar region, the perimeter DBR effectively eliminates dead-FBAR and minimizes coupling of the eTE mode of the collar to the resonator substrate, and the frame (e.g., composite frame) suppresses excitation of propagating modes.

While example embodiments are disclosed herein, one of ordinary skill in the art appreciates that many variations that are in accordance with the present teachings are possible and remain within the scope of the appended claims. For instance, as indicated above, the location, dimensions, and materials of a collar and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator, comprising:
a bottom electrode disposed over a substrate;
a piezoelectric layer disposed over the bottom electrode;
a top electrode disposed over the piezoelectric layer, wherein an overlap of the bottom electrode, the piezoelectric layer and the top electrode defines a main membrane region of the acoustic resonator structure;
a cavity disposed beneath the bottom electrode;
an acoustic reflector disposed over the substrate, and adjacent to the cavity, the acoustic reflector comprising a layer of low acoustic impedance material stacked over a layer of high acoustic impedance material, wherein a thickness of the acoustic reflector is substantially the same as a depth of the cavity, or greater than the depth of the cavity; and
a planarization layer disposed over a portion of the acoustic reflector, and adjacent to the bottom electrode.

2. The BAW resonator as claimed in claim 1, wherein the acoustic reflector is disposed around a perimeter of the air cavity.

3. The BAW resonator of claim 1, further comprising:
a frame disposed within the main membrane region and having an outer edge substantially aligned with a boundary of the main membrane region.

4. The BAW resonator of claim 3, wherein the frame is disposed at a bottom portion of the top electrode.

5. The BAW resonator of claim 3, wherein the frame is disposed at a bottom portion of the bottom electrode.

6. The BAW resonator of claim 3, wherein the frame is disposed at a top portion of the bottom electrode.

7. The BAW resonator of claim 1, further comprising:
a collar formed separate from the frame, disposed outside the main membrane region, and having an inner edge substantially aligned with the boundary of or overlapping the main membrane region.

8. The BAW resonator of claim 7, wherein the planarization is the first planarization layer, and the BAW resonator further comprises:
a second planarization layer disposed over the piezoelectric layer, and adjacent to the top electrode, wherein the collar is disposed over the second planarization layer and the top electrode.

9. The BAW resonator of claim 7, wherein the collar is disposed between the bottom electrode and the piezoelectric layer.

10. The BAW resonator of claim 7, wherein the collar is disposed between the bottom electrode and the acoustic reflector.

11. The BAW resonator of claim 3, further comprising;
an additional frame disposed within the main membrane region and having an outer edge substantially aligned with the boundary of the main membrane region, wherein the frame is disposed at a bottom portion of the top electrode and the additional frame is disposed at one of a bottom portion or a top portion of the bottom electrode.

12. The BAW resonator of claim 3, wherein the frame comprises a composite frame.

13. The BAW resonator of claim 1, wherein the acoustic reflector comprises a distributed Bragg reflector (DBR).

14. A bulk acoustic wave (BAW) resonator, comprising:
an acoustic reflector disposed over a substrate around a perimeter of a cavity, a thickness of the acoustic reflector being substantially the same as a depth of the cavity;
a bottom electrode disposed over the acoustic reflector and the cavity;
a piezoelectric layer disposed over the bottom electrode;
a top electrode disposed over the piezoelectric layer, wherein an overlap of the bottom electrode, the piezoelectric layer and the top electrode defines a main membrane region of the acoustic resonator structure;
a frame disposed within the main membrane region and having an outer edge substantially aligned with a boundary of the main membrane region; and
a collar disposed outside the main membrane region and having an inner edge substantially aligned with the boundary of or overlapping the main membrane region.

15. The BAW resonator of claim 14, wherein the acoustic reflector comprises at least one layer of low acoustic impedance material and at least one layer of high acoustic impedance material.

16. The BAW resonator of claim 15, wherein the collar comprises borosilicate glass, carbon-doped silicon oxide, silicon carbide, silicon nitride, aluminum oxide, aluminum nitride, zinc oxide, lead zirconium titanate, diamond or diamond-like carbon, and
wherein the frame comprises at least one layer of copper, molybdenum, aluminum, tungsten, iridium, borosilicate glass, carbon-doped silicon oxide, silicon carbide, silicon nitride, aluminum oxide, aluminum nitride, zinc oxide, lead zirconium titanate, diamond or diamond-like carbon.

17. The RAW resonator of claim 16, further comprising a planarization layer disposed over the piezoelectric layer, and adjacent to the top electrode.

18. The RAW resonator of claim 17, wherein the collar is disposed over the planarization layer and the top electrode.

19. The RAW resonator of claim 14, further comprising a planarization layer disposed over the piezoelectric layer, and adjacent to the top electrode.

20. The RAW resonator of claim 19, wherein the collar is disposed over the planarization layer and the top electrode.

21. A bulk acoustic wave (BAW) resonator, comprising:
an acoustic reflector disposed over a substrate around a perimeter of a cavity, the acoustic reflector comprising at least one layer of low acoustic impedance material, a thickness of the acoustic reflector being substantially the same as a depth of the cavity;

a bottom electrode disposed over the acoustic reflector and the cavity;

a piezoelectric layer disposed over the bottom electrode;

a top electrode disposed over the piezoelectric layer, wherein an overlap of the bottom electrode, the piezoelectric layer and the top electrode defines a main membrane region of the acoustic resonator structure;

a frame disposed within the main membrane region and having, an outer edge substantially aligned with a boundary of the main membrane region; and a collar disposed outside the main membrane region and having an inner edge substantially aligned with the boundary of or overlapping the main membrane region.

22. The BAW resonator of claim 21, wherein the collar is disposed between the bottom electrode and the piezoelectric layer.

23. The BAW resonator of claim 21, wherein the collar is disposed between the bottom electrode and the acoustic reflector.

24. The BAW resonator of claim 21, wherein the frame comprises a composite frame.

25. The BMW resonator of claim 21, wherein the acoustic reflector comprises a distributed Bragg reflector (DBR).

26. A bulk acoustic wave (BAW) resonator, comprising:
a bottom electrode disposed over a substrate;
a piezoelectric layer disposed over the bottom electrode;
a top electrode disposed over the piezoelectric layer, wherein an overlap of the bottom electrode, the piezoelectric layer and the top electrode defines a main membrane region of the acoustic resonator structure;

a cavity disposed beneath the bottom electrode;

an acoustic reflector disposed over the substrate, and adjacent to the cavity, the acoustic reflector comprising a layer of low acoustic impedance material stacked over a layer of high acoustic impedance material;

a frame disposed within the main membrane region and having an outer edge substantially aligned with a boundary of the main membrane region;

a collar, separate from the frame, disposed outside the main membrane region, and having an inner edge substantially aligned with the boundary of the main membrane region, or overlapping the main membrane region; and a planarization layer disposed over a portion of the acoustic reflector, and adjacent to the bottom electrode.

27. The RAW resonator of claim 26, wherein the collar is disposed between the bottom electrode and the piezoelectric layer.

28. The BAW resonator of claim 26, wherein the collar is disposed between the bottom electrode and the acoustic reflector.

29. The RAW resonator of claim 26, wherein the frame comprises a composite frame.

30. The RAW resonator of claim 26, wherein the acoustic reflector comprises a distributed Bragg reflector (DBR).

31. The RAW resonator of claim 26, wherein the planarization layer is a first planarization layer, and the RAW resonator comprises a second planarization layer disposed over the piezoelectric layer, and adjacent to the top electrode, wherein the collar is disposed over the planarization layer and the top electrode.

* * * * *